(12) United States Patent
Liao et al.

(10) Patent No.: US 12,310,255 B2
(45) Date of Patent: May 20, 2025

(54) STRUCTURE AND METHOD FOR AN MRAM DEVICE WITH A MULTI-LAYER TOP ELECTRODE

(71) Applicant: Taiwan Semiconductor Manufacturing Co., Ltd., Hsin-Chu (TW)

(72) Inventors: Wei-Hao Liao, Taichung (TW); Hsi-Wen Tien, Hsinchu County (TW); Chih Wei Lu, Hsinchu (TW); Pin-Ren Dai, New Taipei (TW); Chung-Ju Lee, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 18 days.

(21) Appl. No.: 17/814,917

(22) Filed: Jul. 26, 2022

(65) Prior Publication Data
US 2022/0376169 A1   Nov. 24, 2022

Related U.S. Application Data

(62) Division of application No. 16/510,296, filed on Jul. 12, 2019, now Pat. No. 11,563,167.

(60) Provisional application No. 62/736,623, filed on Sep. 26, 2018.

(51) Int. Cl.
    *H10N 50/80*   (2023.01)
    *G11C 11/16*   (2006.01)
    *H10B 61/00*   (2023.01)
    *H10N 50/01*   (2023.01)

(52) U.S. Cl.
    CPC .......... *H10N 50/80* (2023.02); *G11C 11/161* (2013.01); *H10B 61/00* (2023.02); *H10N 50/01* (2023.02)

(58) Field of Classification Search
    CPC ..... H01L 27/222–228; H01L 43/02–12; G11C 11/161; G11C 2211/5615; H10B 61/00; H10N 50/80; H10N 50/01; H10N 50/10
    See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,802,504 B1 | 8/2014 | Hou et al. |
| 8,803,292 B2 | 8/2014 | Chen et al. |
| 8,803,316 B2 | 8/2014 | Lin et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,993,380 B2 | 3/2015 | Hou et al. |
| 9,105,490 B2 | 8/2015 | Wang et al. |
| 9,236,267 B2 | 1/2016 | De et al. |

(Continued)

*Primary Examiner* — Nelson Garces
(74) *Attorney, Agent, or Firm* — HAYNES AND BOONE, LLP

(57) ABSTRACT

A memory device includes a bottom electrode, a tunneling junction disposed over the bottom electrode, and a top electrode disposed over the tunneling junction. The top electrode includes a first top electrode layer and a second top electrode layer above the first top electrode layer. The first and second top electrode layers include different material compositions. The first top electrode layer is thinner than the tunneling junction, and the second top electrode layer is thicker than the tunneling junction.

20 Claims, 24 Drawing Sheets

(56) References Cited

U.S. PATENT DOCUMENTS

| | | | |
|---|---|---|---|
| 9,236,300 B2 | 1/2016 | Liaw | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 9,520,482 B1 | 12/2016 | Chang et al. | |
| 9,576,814 B2 | 2/2017 | Wu et al. | |
| 2015/0221865 A1* | 8/2015 | Tada | H10N 70/8833 257/4 |
| 2016/0268499 A1* | 9/2016 | You | H10N 50/01 |
| 2016/0380183 A1* | 12/2016 | Chuang | H10N 50/01 257/421 |
| 2017/0018704 A1* | 1/2017 | Chuang | H10B 61/22 |
| 2017/0263861 A1* | 9/2017 | Park | H10B 61/00 |
| 2018/0033957 A1* | 2/2018 | Zhang | H10N 50/01 |
| 2018/0358070 A1* | 12/2018 | Song | G11C 11/1659 |
| 2019/0088864 A1* | 3/2019 | Cho | H10B 61/20 |
| 2022/0352342 A1* | 11/2022 | An | H01L 23/5226 |

\* cited by examiner

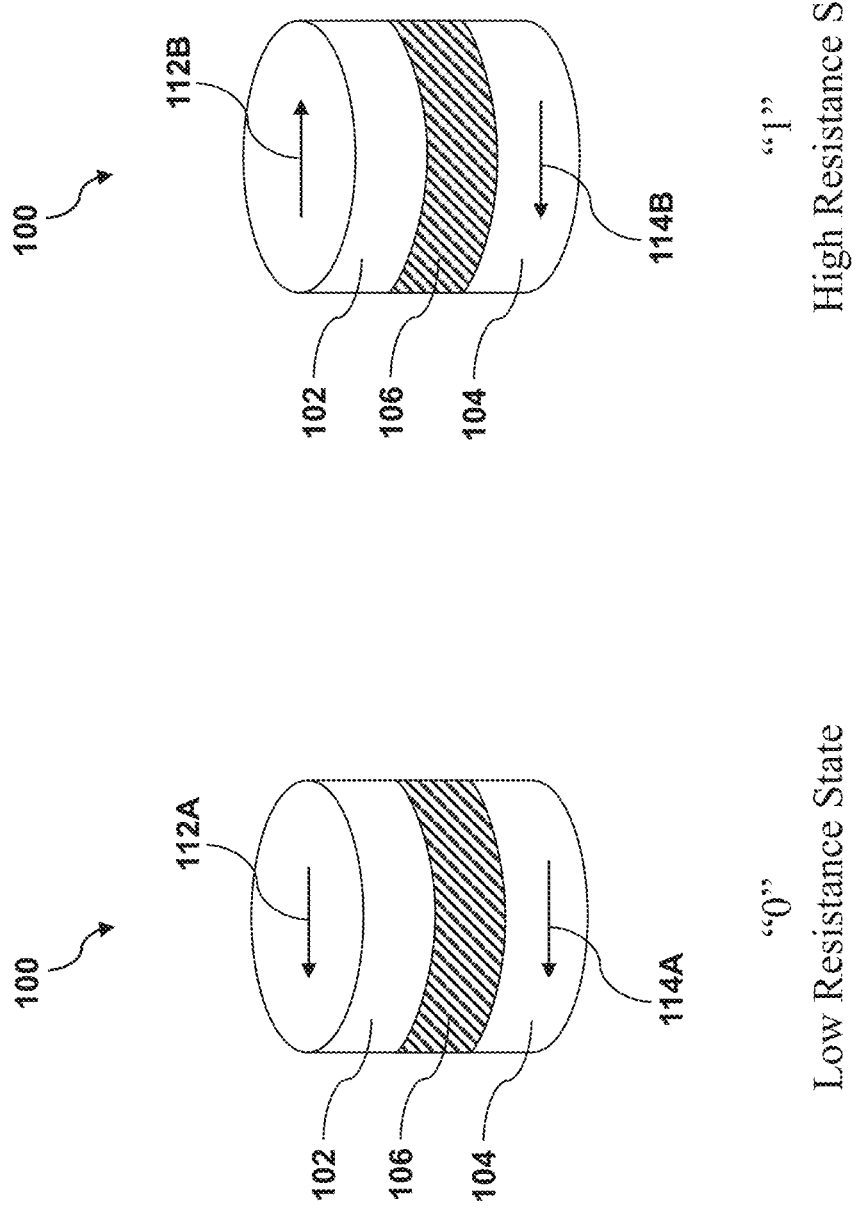

STRUCTURE AND METHOD FOR AN MRAM DEVICE WITH A MULTI-LAYER TOP ELECTRODE

PRIORITY DATA

This is a divisional application of U.S. patent application Ser. No. 16/510,296 filed on Jul. 12, 2019, which claims priority to U.S. Provisional Patent Application Ser. No. 62/736,623 filed on Sep. 26, 2018, the entire disclosures of which are herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the developing of non-volatile memory (NVM), and in particular to magnetic random-access memory (MRAM). MRAM offers comparable performance to volatile static random-access memory (SRAM) and comparable density with lower power consumption to volatile dynamic random access memory (DRAM). Compared to NVM Flash memory, MRAM may offer faster access times and suffer less degradation over time. An MRAM cell is formed by a magnetic tunneling junction (MTJ) comprising two ferromagnetic layers which are separated by a thin insulating barrier, and operates by tunneling of electrons between the two ferromagnetic layers through the insulating barrier. Scaling of MRAM cells in advanced technology nodes is limited by the resolution limit of both lithography and etching techniques. At the lower resolution limit, MTJ size variation between MRAM cells within an MRAM cell array can degrade memory performance. Although existing approaches in MRAM device formation have generally been adequate for their intended purposes, they have not been entirely satisfactory in all respects. Accordingly, there exists a need for improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B illustrate perspective views of a magnetic tunneling junction (MTJ) within an MRAM cell.

DETAILED DESCRIPTION

Figure 1C:
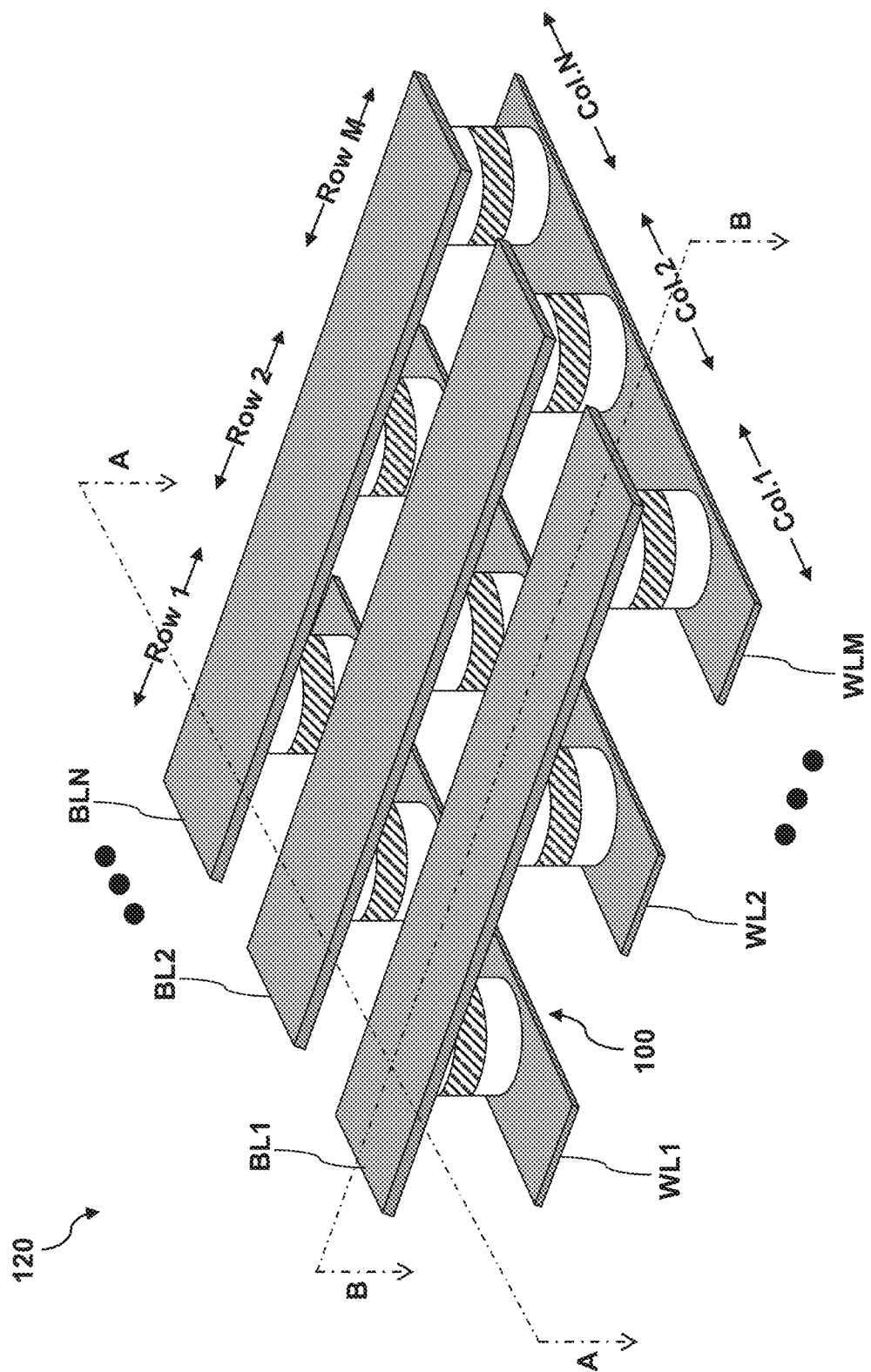
FIG. 1C illustrates an MRAM cell array, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods. Some aspects of the present disclosure relate to scaling techniques for magnetic random-access memory (MRAM) cells. More particularly, the present disclosure is related to providing a magnetic tunneling junction (MTJ) together with top and bottom electrodes and a method that achieves a substantially uniform pattern of MTJs within MRAM cells of an MRAM cell array, and further achieves a minimum MTJ dimension below the lower resolution limit of some optical lithography techniques.

In the forming of an MRAM cell, the critical dimension (CD) of an MTJ affects many operating parameters of integrated circuits, such as form factors, speed performance, power consumption, and thermal stability of an MRAM cell array. For an MRAM cell array patterned at the lower resolution limit of optical lithography, non-uniformity in the MTJ CD within the MRAM cells drives a non-uniform current density and variation in read/write characteristics between the MRAM cells. Non-uniformity in the dimensions of the MTJ also leads to a variation in coercivity between the MRAM cells due to the size variation. Additionally, the size and density of the MTJ are limited by the lower resolution limit of optical lithography (e.g., a lower limit of about 30 nm). Variation in the volume of an MTJ also leads to non-uniform thermal stability which also contributes to variable magnetoresistance between the MRAM cells. To achieve a minimum MTJ CD and to reduce MTJ CD bias, a multi-layer (e.g., a bilayer or a tri-layer) top electrode is formed above an MTJ stack, in some embodiments of the present disclosure. Each sub-layer of the multi-layer top electrode is constructed with different conductive material compositions, resulting in high etching selectivity of an upper sub-layer (e.g., the topmost sub-layer of a bilayer top electrode) to one or more bottom sub-layers during an etching process. Patterning of the top electrode in one etching process may cause damages to the underlying MTJ stack by the etchants applied. In embodiments of the present disclosure, the high etching selectivity between the upper and bottom sub-layers allows the upper sub-layer and the bottom sub-layer(s) to be patterned separately. During the etching of the upper sub-layer, the bottom sub-layer(s) of the top electrode functions as an etching stop layer which protects the underlying MTJ stack from being damaged during the etching. The high etching selectivity also allows trimming the upper sub-layer with substantially vertical sidewalls without forming a footing profile, which would otherwise enlarge the MTJ CD. A patterning process then transfers a pattern in the upper sub-layer of the top electrode to the underlying sub-layers and the MTJ stack, while utilizing the upper sub-layer as a patterning mask. The present disclosure also helps to maintain the uniformity of the MTJ CD at a wafer scale.

FIGS. 1A and 1B illustrate perspective views of an MTJ 100 within an MRAM cell. The MTJ 100 includes an upper ferromagnetic plate 102 and a lower ferromagnetic plate 104, which are separated by a thin insulating layer 106, also referred to as a tunnel barrier layer. One of the two ferromagnetic plates (e.g., the lower ferromagnetic plate 104) is a magnetic layer that is pinned to an antiferromagnetic layer, while the other ferromagnetic plate (e.g., the upper ferromagnetic plate 102) is a "free" magnetic layer that can have its magnetic field changed to one of two or more values to store one of two or more corresponding data states.

The MTJ 100 uses tunnel magnetoresistance (TMR) to store magnetic fields on the upper and lower ferromagnetic plates 102 and 104. For sufficiently thin insulating layer 106 thicknesses (e.g., about 10 nm or less), electrons can tunnel from the upper ferromagnetic plate 102 to the lower ferromagnetic plate 104. Data may be written to the cell in a variety of ways. In one method, current is passed between the upper and lower ferromagnetic plates 102 and 104, which induces a magnetic field stored in the free magnetic layer (e.g., the upper ferromagnetic plate 102). In another method, spin-transfer-torque (STT) is utilized, wherein a spin-aligned or polarized electron flow is used to change the magnetic field within the free magnetic layer with respect to the pinned magnetic layer. Other methods to write data may be used. However, all data write methods include changing the magnetic field within the free magnetic layer with respect to the pinned magnetic layer.

The electrical resistance of the MTJ 100 changes in accordance with the magnetic fields stored in the upper and lower ferromagnetic plates 102 and 104, due to the magnetic tunnel effect. For example, in FIG. 1A, the magnetic fields of the upper and lower ferromagnetic plates 102 and 104 are aligned (see arrows 112A and 114A), resulting in a low-resistance state (i.e., a logical "0" state). In FIG. 1B, a current has been passed through the MTJ 100 to induce a change in the magnetic field of the magnetic free layer (e.g., upper ferromagnetic plate 102). Therefore, after this data write operation the magnetic fields in the upper and lower ferromagnetic plates 102 and 104 oppose one another (see arrows 112B and 114B), which gives rise to a high resistance state (i.e., a logical "1" state). Hence, by measuring the electrical resistance between the upper and lower ferromagnetic plates 102 and 104, read circuitry coupled to the MTJ 100 can discern between "0" and "1" data states.

FIG. 1C illustrates an MRAM cell array 120, which includes M rows (words) and N columns (bits) of MRAM cells. Each MRAM cell comprises an MTJ 100. Word lines $WL_1$, $WL_2$, . . . $WL_M$ extend across respective rows of memory cells and bit lines $B_{L1}$, $BL_2$, . . . $BL_N$ extend along columns. To write data to a row of cells, a word line (WL) is asserted to select a row and appropriate biases are applied to the individual bit lines (BLs) to write respective values to the respective MRAM cells of the selected row. When data is written to or read from multiple cells along a row (e.g., a multi-bit word), data errors can occur for one or more MRAM cells due to manufacturing variations across the memory array that leads to erroneous bits being written to the MRAM cell array 120. Therefore, there is a need to maintain CD uniformity at the lower resolution limit of manufacturing techniques.

Figure 2A:
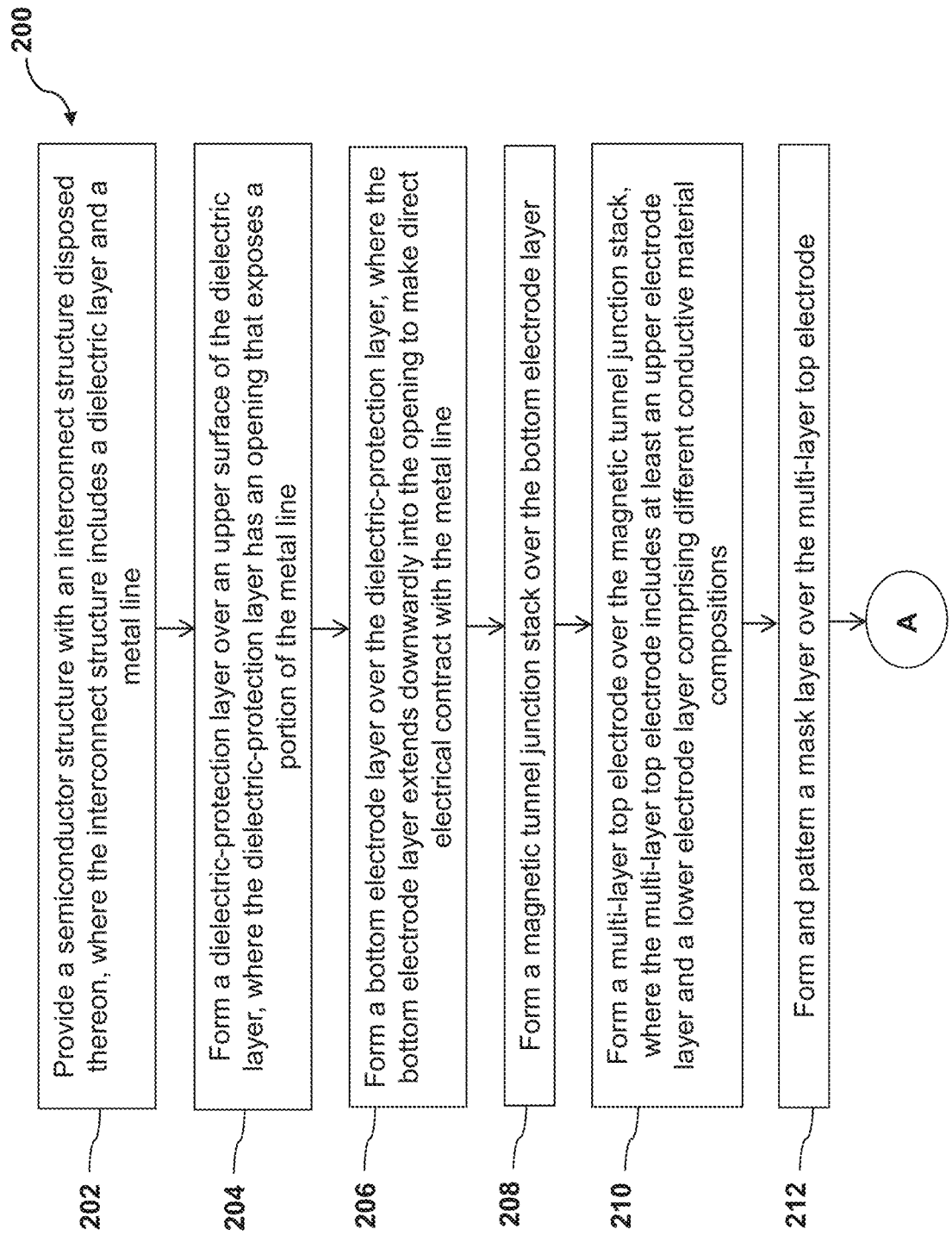
FIGS. 2A and 2B show a flow chart of a method for forming a magnetic random-access memory (MRAM) cell array, according to aspects of the present disclosure.
Figure 2B:
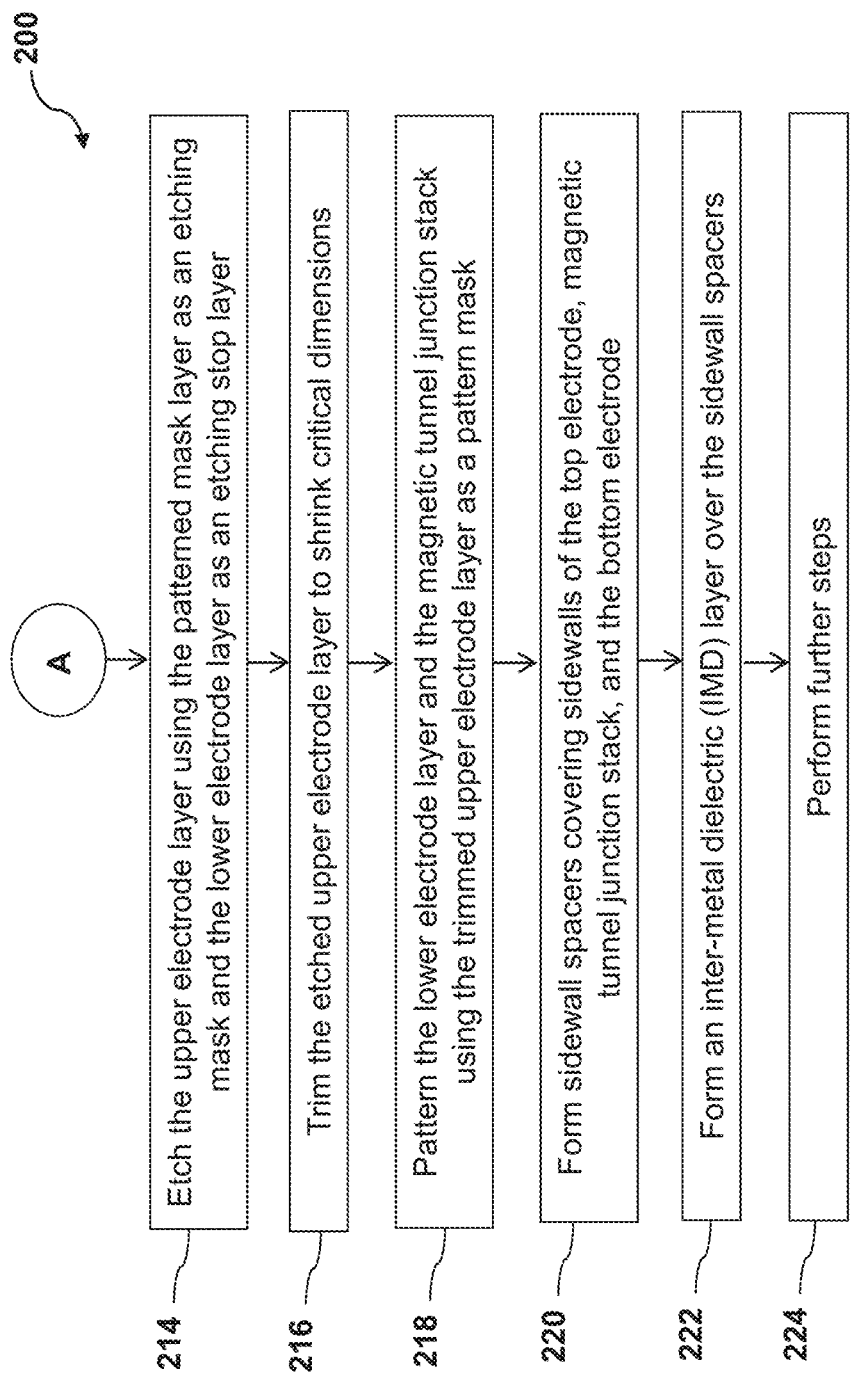

FIGS. 2A and 2B illustrate a flow chart of a method 200 for forming an MRAM cell array in accordance with an embodiment. The method 200 is merely an example, not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-21, which illustrate various cross-sectional and perspective views of an MRAM cell array during fabrication steps according to the method 200.

Figure 3:
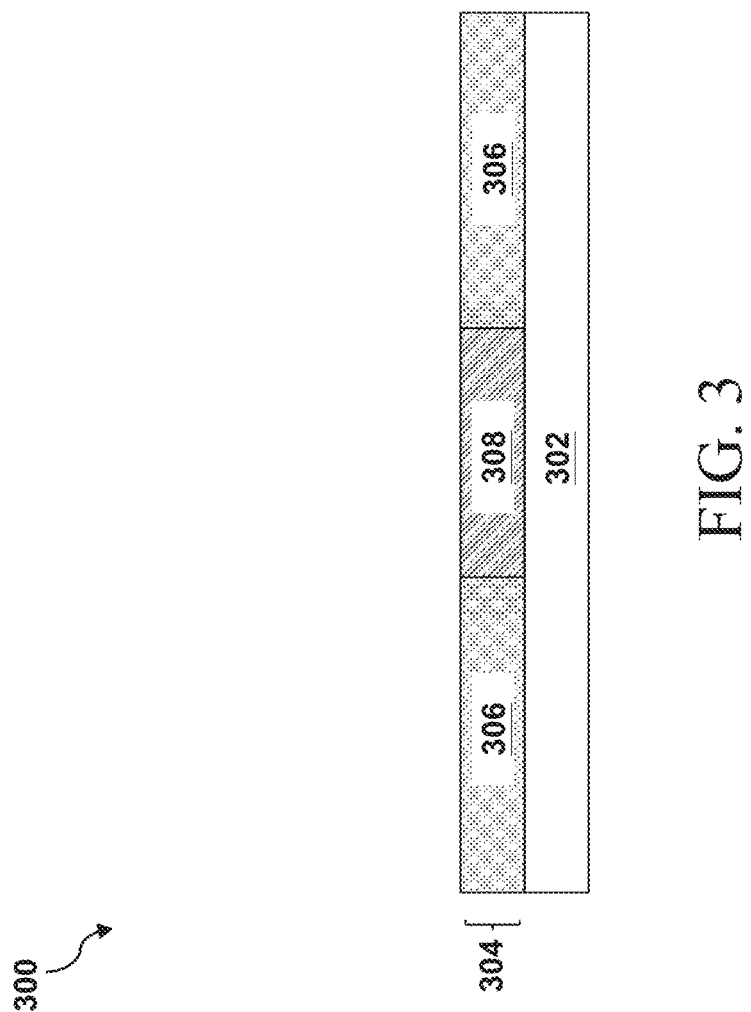
FIGS. 3, 4, 5, 6, 7, 8, 9, 10, 13, 14, 15, 16, 17, 18, 19, 20A, 20B, and 21 illustrate cross-sectional views of a semiconductor structure during a fabrication process according to the method of FIGS. 2A-2B, in accordance with some embodiments.

At operation 202, the method 200 (FIG. 2A) provides, or is provided with, a device structure 300 having a substrate 302, such as shown in FIG. 3. The substrate 302 is a silicon substrate in the illustrated embodiment. Alternatively, the substrate 302 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In another embodiment, the substrate 302 includes indium tin oxide (ITO) glass. In various embodiments, the substrate 302 is a wafer, such as a silicon wafer, and may include one or more epitaxially grown semiconductor layers in its upper portion.

The substrate 302 is disposed with an interconnect structure 304 on its upper surface. The interconnect structure 304 includes an inter-metal dielectric (IMD) layer 306 and a metal line 308 which extends horizontally through the IMD layer 306. The IMD layer 306 can be an oxide, such as silicon dioxide, a low-k dielectric material such as carbon doped oxides, or an extreme low-k dielectric material such as porous carbon doped silicon dioxide. The metal line 308 can be made of a metal, such as aluminum, copper, or combinations thereof.

Figure 4:
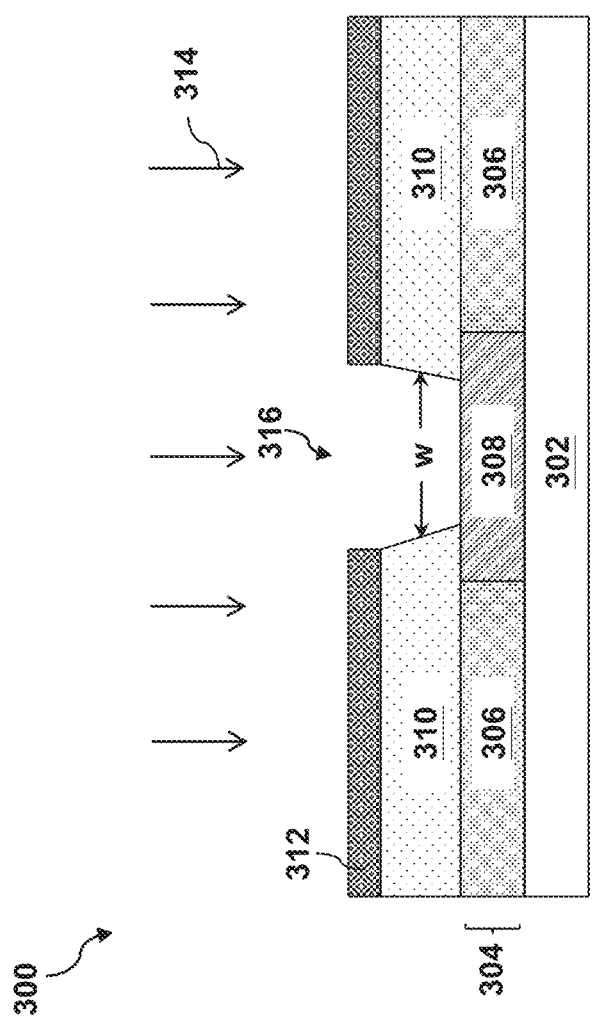

At operation 204, the method 200 (FIG. 2A) forms a dielectric-protection layer 310 over the interconnect structure 304, such as shown in FIG. 4. The dielectric-protection layer 310 is made of dielectric material, such as silicon oxide, silicon nitride, silicon oxynitride, or combinations thereof. The dielectric-protection layer 310 may be deposited through a process such as CVD, PVD or other suitable methods. In some embodiments, the dielectric-protection layer 310 comprises silicon carbide. In the illustrated embodiment, the dielectric-protection layer 310 comprises aluminum oxide having a thickness of approximately 200 Å. After the dielectric-protection layer 310 is formed, a mask 312, such as a photoresist mask, is then formed over the dielectric-protection layer 310. An etching process 314 is then carried out with the mask 312 in place to form patterned dielectric-protection layer 310. The etching process 314 can be performed when a wet etchant or a plasma etchant is applied to the dielectric-protection layer 310 with the mask 312 in place, and forms an opening 316 which exposes a portion of the metal line 308. The opening 316 can have a width w which corresponds to a width of a via in the interconnect structure 304. The mask 312 can be removed after the etching.

Figure 5:
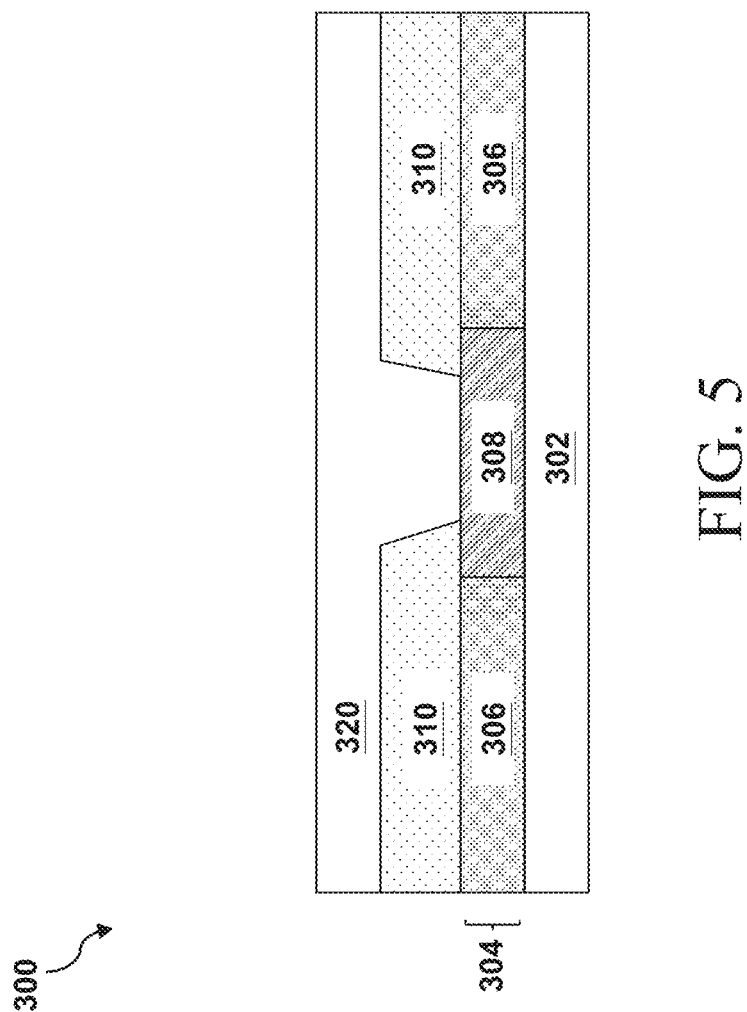

At operation 206, the method 200 (FIG. 2A) forms a bottom electrode layer 320 over the dielectric-protection layer 310, such as shown in FIG. 5. The bottom electrode layer 320 extends downwardly into the opening 316 (FIG. 4) to make direct electrical contact with the metal line 308. The bottom electrode layer 320 may be a conductive material, such as, for example, titanium nitride, tantalum nitride, titanium, tantalum, or a combination of one or more of the foregoing. The bottom electrode layer 320 may be deposited through a process such as ALD, CVD, PVD or other suitable methods. For example, the bottom electrode layer 320 may be formed by depositing tantalum in a PVD process at a temperature above 300 degrees in Celsius. The bottom electrode layer 320 may be, for example, about 10-100 nanometers thick in some embodiments. The top surface of the bottom electrode layer 320 may have a non-planar top surface after deposition and may be planarized in one or more CMP processes thereafter.

Notably, the bottom electrode layer 320 is a continuous conductive body in direct electrical contact with the underlying metal line 308, rather than relying on an extra via or contact feature for coupling. Because there is no extra via or contact feature between the bottom electrode layer 320 and the underlying metal layer 308, the overall height of the MRAM cell to be formed thereon can be reduced. This reduced overall height makes the MRAM cell more easily compatible with back-end-of-line (BEOL) process flows, providing better MRAM operations with reduced manufacturing cost.

Figure 6:
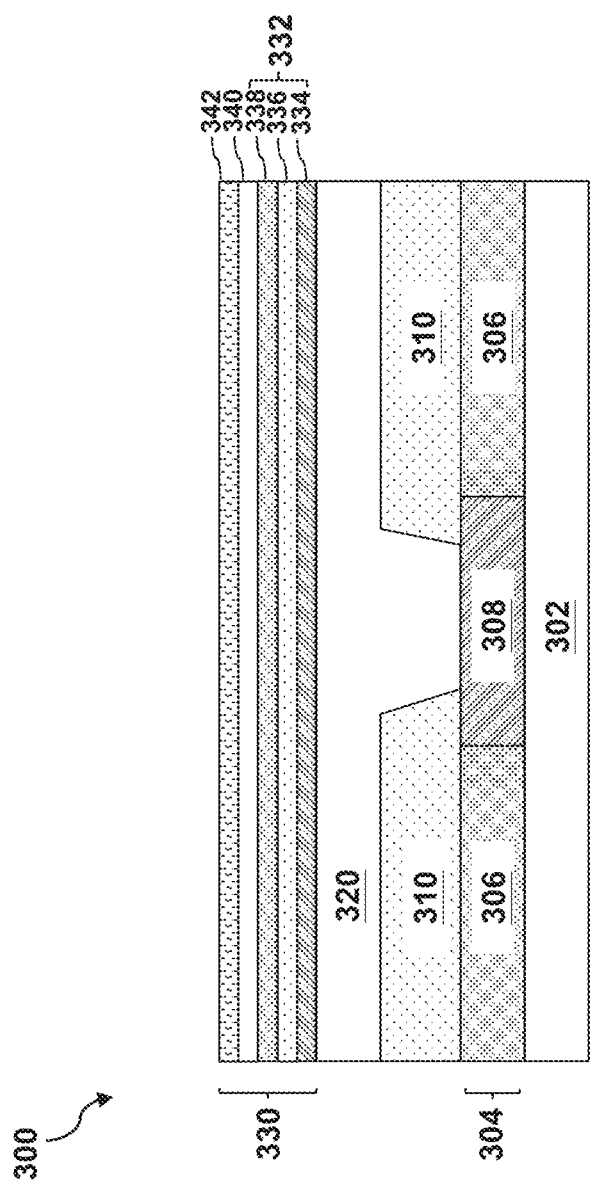

At operation 208, the method 200 (FIG. 2A) forms a magnetic tunneling junction (MTJ) stack 330 over an upper surface of the bottom electrode layer 320, such as shown in FIG. 6. In the illustrated embodiment, the MTJ stack 330 includes a lower ferromagnetic electrode layer 332 (which can have a pinned magnetic orientation) and an upper ferromagnetic electrode layer 342 (which can have a free magnetic orientation). A tunneling barrier layer 340 is disposed between the lower and upper ferromagnetic electrodes layers 332 and 342. The lower ferromagnetic electrode layer 332 can be a synthetic anti-ferromagnetic (SAF) structure that includes a bottom pinned ferromagnetic layer 334, a top pinned ferromagnetic layer 338, and a metal layer 336 sandwiched between the bottom and top pinned ferromagnetic layers 334 and 338. Each layer of the MTJ stack 330 is disposed through appropriate layer growth techniques. Some layer growth techniques comprise sputter deposition, molecular beam epitaxy (MBE), pulsed laser deposition (PLD), atomic layer deposition (ALD) and electron beam (e-beam) epitaxy, chemical vapor deposition (CVD), or derivative CVD processes further comprising low pressure CVD (LPCVD), atomic layer CVD (ALCVD), ultrahigh vacuum CVD (UHVCVD), reduced pressure CVD (RPCVD), or any combinations thereof.

In some embodiments, the upper ferromagnetic electrode layer 342 comprises Fe, Co, Ni, FeCo, CoNi, CoFeB, FeB, FePt, FePd, or the like, and has a thickness ranging between approximately 8 Å and approximately 13 Å. In some embodiments, the tunneling barrier layer 340 provides electrical isolation between the upper ferromagnetic electrode layer 342 and the lower ferromagnetic electrode layer 332, while still allowing electrons to tunnel through the tunneling barrier layer 340 under proper conditions. The tunneling barrier layer 340 may comprise, for example, magnesium oxide (MgO), aluminum oxide (e.g., $Al_2O_3$), NiO, GdO, $Ta_2O_5$, $MoO_2$, $TiO_2$, $WO_2$, or the like. Further, the tunneling barrier layer 340 may be, for example, about 100-200 Å thick. In an embodiment, the bottom pinned ferromagnetic layer 334 includes a CoFeB film. Alternatively, the bottom pinned ferromagnetic layer 334 may comprise other materials, such as CoFeTa, NiFe, Co, CoFe, CoPt, CoPd, FePt, or an alloy of Ni, Co, and Fe. In an embodiment, the metal layer 336 includes ruthenium (Ru). Alternatively, the metal layer 336 may include other suitable material, such as Ti, Ta, Cu, or Ag. In some embodiments, the top pinned ferromagnetic layer 338 includes a ferromagnetic material substantially similar to that of the bottom pinned ferromagnetic layer 334. For example, the top pinned ferromagnetic layer 338 includes a CoFeB film. In various embodiments, the MTJ stack 330 has a total height in a range from about 200 Å to about 400 Å.

Figure 7:
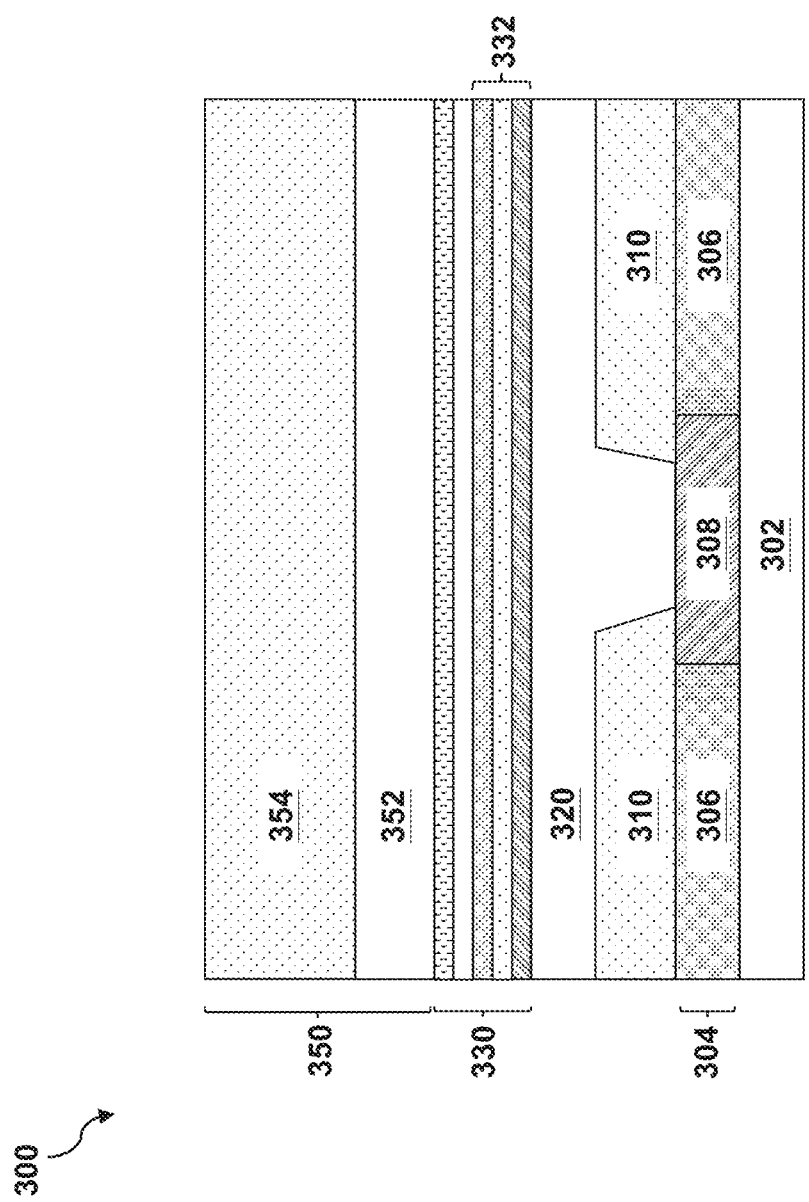

At operation 210, the method 200 (FIG. 2A) forms a multi-layer top electrode layer 350 over an upper surface of the MTJ stack 330, such as shown in FIG. 7. In the illustrated embodiment, the multi-layer top electrode layer 350 is a bilayer that includes a lower electrode layer 352 and an upper electrode layer 354. The lower and upper electrode layers 352 and 354 both comprise conductive materials, such as metal, metal nitride, metal carbide, or combinations thereof. The composition of the lower and upper electrode layers 352 and 354 are selected such that the upper electrode layer 354 has a high etch selectivity as compared to the lower electrode layer 352. As to be shown in subsequent operations of the method 200, the upper electrode layer 354 will be etched and trimmed to define a pattern to transfer to the MTJ stack 330, during which the lower electrode layer 352 will function as an etch stop layer to protect the MTJ stack 330 from damage. In some embodiments, the upper electrode layer 354 comprises tantalum and the lower electrode layer 352 comprises titanium nitride. Alternatively, the lower electrode layer 352 may comprise other conductive materials, such as titanium, tungsten, tungsten nitride, or the like. In one specific example, the upper electrode layer 354 comprises tantalum and the lower electrode layer 352 comprises tungsten carbide. The lower and upper electrode layers 352 and 354 may respectively be deposited through a process such as ALD, CVD, PVD, or other suitable methods. For example, the lower electrode layer 352 may be deposited in a PVD process at a temperature above 300 degrees in Celsius, and the upper electrode layer 354 may be subsequently deposited in a PVD process in-situ at a temperature above 300 degrees in Celsius.

The inventors have observed that when the thickness of the lower electrode layer 352 is larger than about 35% of the MTJ stack 330, the MTJ stack 330 can be effectively protected from being oxidized during subsequent operations. Furthermore, when the thickness of the upper electrode layer 354 is larger than 110% of the MTJ stack 330 and the lower electrode layer 352 is larger than 35% of the MTJ stack 330, the MTJ stack 330 can be protected from damages otherwise caused by fluorine or chlorine containing molecules that might penetrate into MTJ stack layers during subsequent operations. In the illustrated embodiment, the lower electrode layer 352 has a thickness in a range of about 35% to about 90% of the MTJ stack 330, and the upper electrode layer 354 has a thickness in a range of about 110% to about 300% of the MTJ stack 330. In various embodiments, the lower electrode layer 352 may have a thickness in a range from about 70 Å to about 180 Å, and the upper electrode layer 354 may have a thickness in a range from about 220 Å to about 500 Å.

In some embodiments, the lower electrode layer 352 may further include two or more sub-layers. Each sub-layer comprises conductive materials, such as metal, metal nitride, metal carbide, or combinations thereof. When the lower electrode layer 352 has two sub-layers, together with the upper electrode layer 354, the top electrode layer 350 is regarded as a tri-layer stack. From top to bottom, in one example, the top electrode layer 350 comprises a Ta/Ti/W tri-layer stack. In another example, the top electrode layer 350 comprises a Ta/W/TiN tri-layer stack. In another example, the top electrode layer 350 comprises a Ta/TiN/WN tri-layer stack. In yet another example, the top electrode layer 350 comprises a Ta/WN/WC tri-layer stack.

Figure 8:
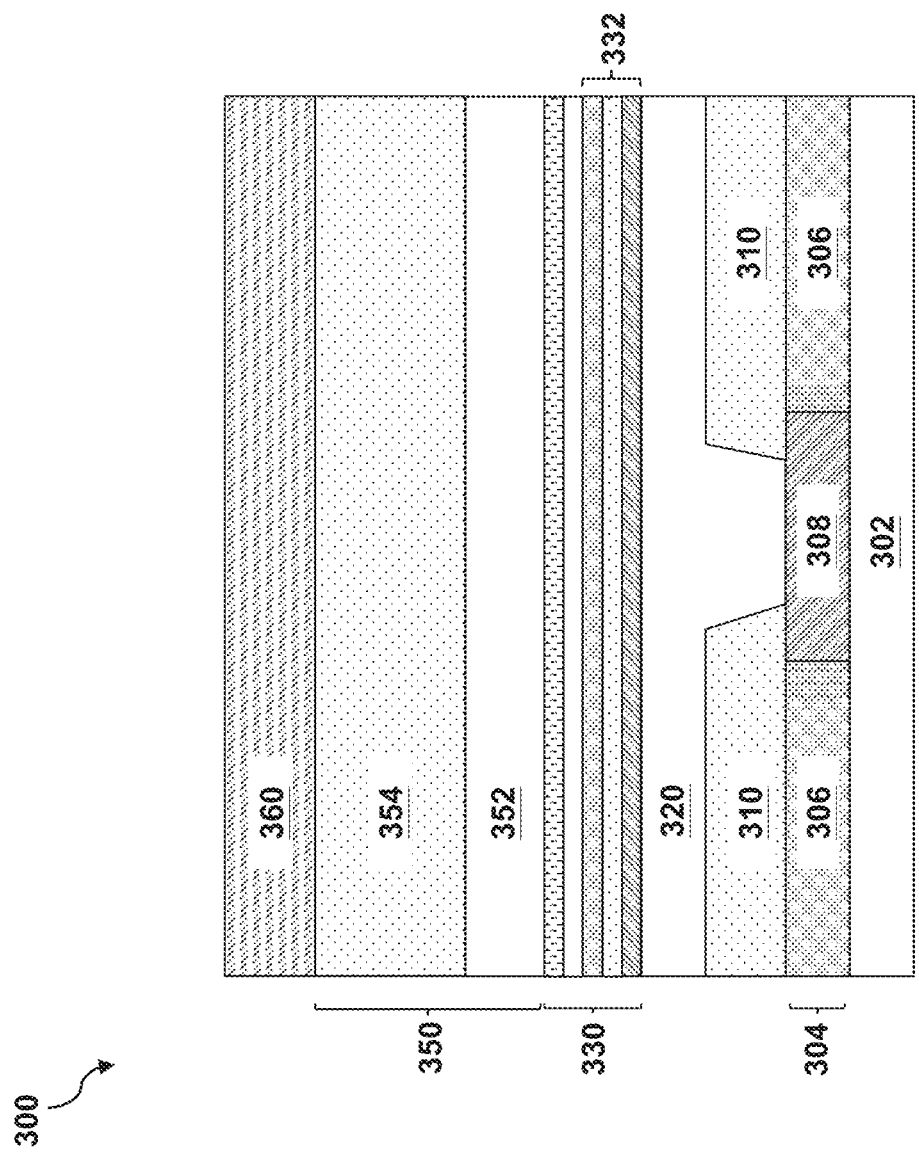

At operation 212, the method 200 (FIG. 2A) forms a hard mask layer 360 over the top electrode layer 350, such as shown in FIG. 8. The hard mask layer 360 may include one or more patterning layers. In some embodiments, the hard mask layer 360 comprises dielectric material such as silicon oxide, silicon nitride, silicon oxynitride, amorphous carbon (APF), or suitable combination thereof. The hard mask layer 360 may be deposited through a process such as CVD or other suitable methods. The hard mask layer 360 may have a thickness ranging from about 150 Å to about 850 Å.

Figure 9:
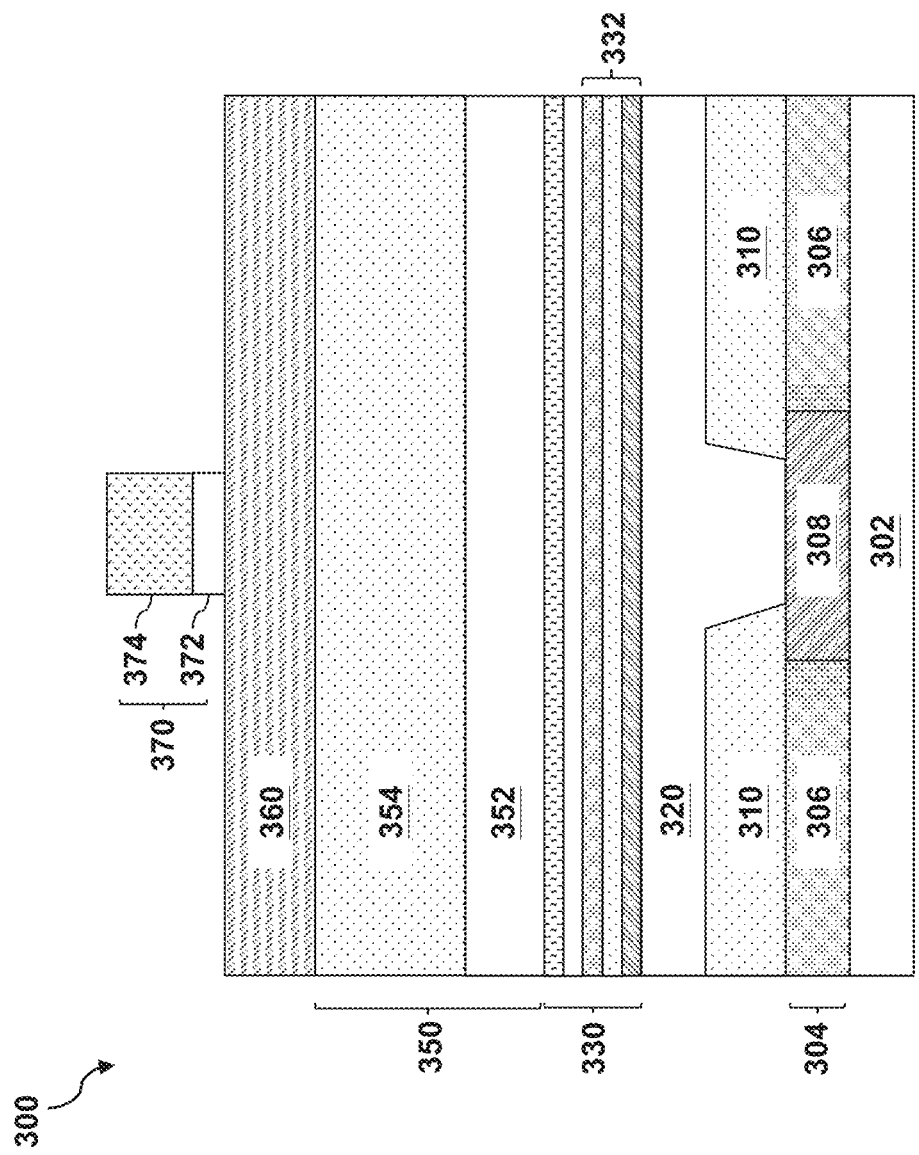
Figure 10:
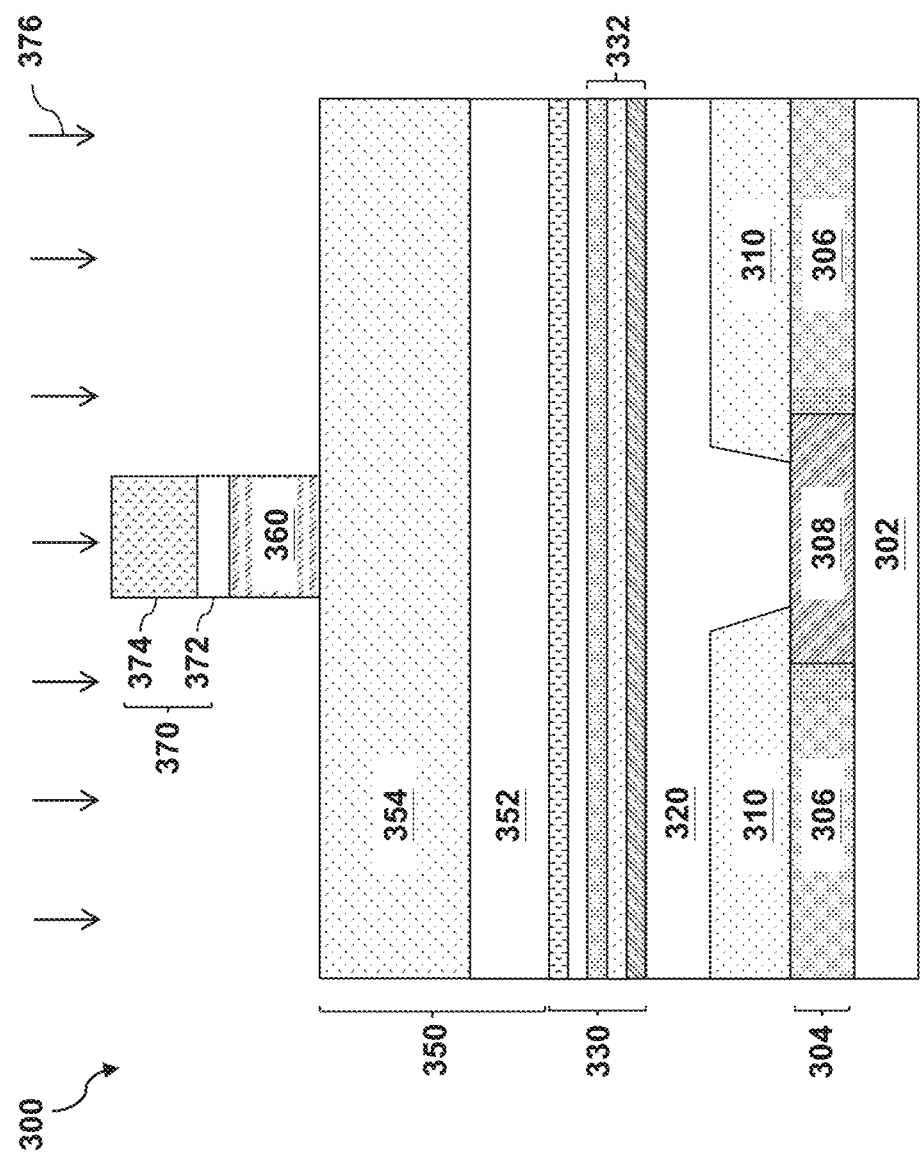

Operation 212 further includes patterning the hard mask layer 360 by photolithography and etching processes, such as shown in FIGS. 9 and 10. The photolithography and etching processes may first form and pattern a resist layer 370 over the hard mask layer 360, then pattern the hard mask layer 360 using the patterned resist layer 370 as an etching mask. The resist layer 370 may include two or more layers, such as a bottom anti-reflective coating (BARC) layer 372 and a photosensitive layer 374 in the illustrated embodiment. An exemplary photolithography process may include a lithographic exposure to perform on the photosensitive layer 374 that exposes selected regions to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene. After the photoresist is developed, a pattern formed in the photosensitive layer 374 is transferred to the BARC layer 372 by selectively etching through openings in the developed photosensitive layer 374, resulting in a patterned resist layer 370. Subsequently, such as shown in FIG. 10, the exposed portions of the hard mask layer 360 may be removed by an etching process 376, such as wet etching, dry etching, Reactive Ion Etching (RIE), ashing, and/or other etching methods, resulting in a patterned hard mask layer 360. The patterned hard mask layer 360 may be in a form of a pillar with a circular shape from a top view. The shape of the patterned hard mask layer 360 will be transferred to the top electrode layer 350 and the underlying MTJ stack 330 by patterning methods disclosed in subsequent embodiments herein. After patterning the hard mask layer 360, the resist layer 370 may be removed.

Alternatively, operation 212 may use a polymer self-assembling process instead of a regular photolithography process to form a patterned dielectric layer over the hard mask layer 360, such as a pillar array. An exemplary polymer self-assembling process includes first spin-coating a copolymer solution comprising first and second polymer species. The copolymer solution is subjected to self-assembly into a phase-separated material comprising a regular pattern of micro-domains of the second polymer species within a polymer matrix comprising the first polymer species. The first polymer species is then removed resulting with a pattern of micro-domains of the second polymer species. The pattern is then transferred to lower material layers by etching through while utilizing the pattern of micro-domains formed by the second polymer species as an etching mask.

Figure 11:
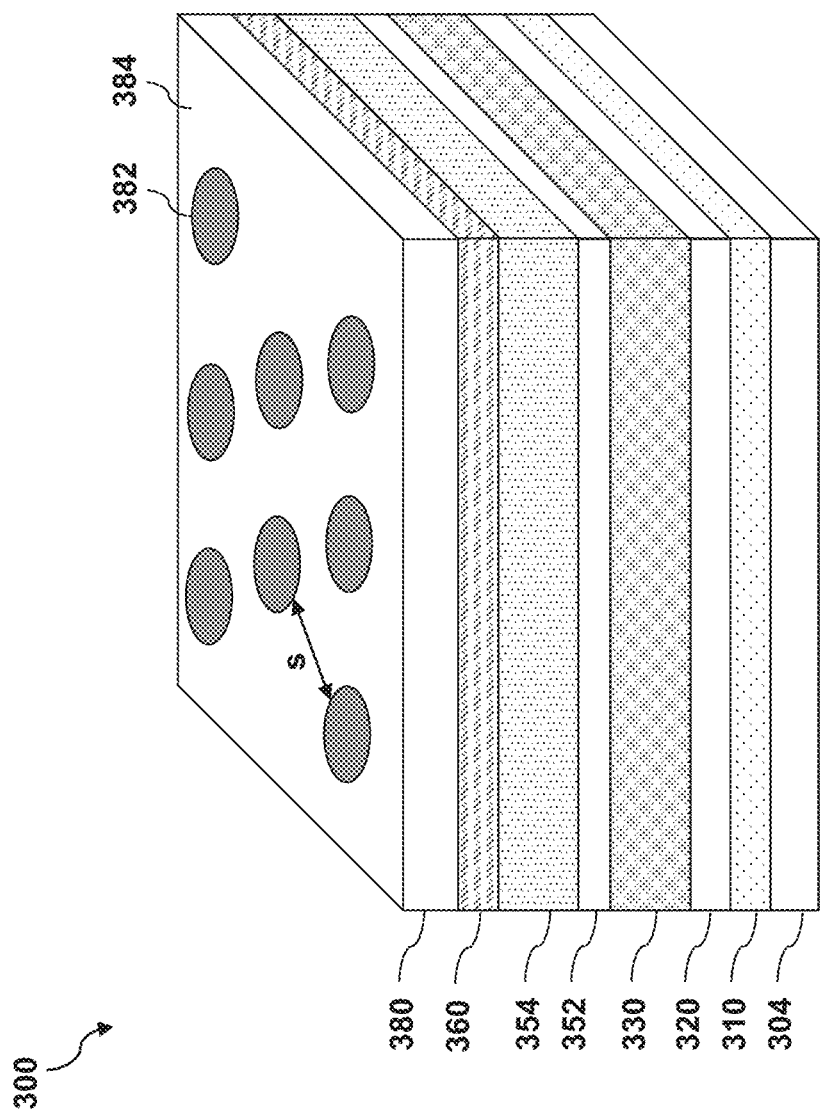
FIGS. 11 and 12 illustrate perspective views of a semiconductor structure during a fabrication process according to the method of FIGS. 2A-2B, in accordance with some embodiments.

In the illustrated embodiment, a block copolymer 380 is deposited by spin-coating the hard mask layer 360 with a copolymer solution comprising the first and second polymer species, such as shown in FIG. 11. The copolymer solution may comprise poly(styrene-block-methylmethacrylate) (PS-b-PMMA), wherein the first polymer species comprises poly(methyl methacrylate) (PMMA), and the second polymer species comprises polystyrene (PS). In some embodiments, the volume fraction of the first and second polymer species is larger than about 0.6:0.4. The device 300 is then annealed through a thermal anneal or solvent anneal process (e.g., a UV irradiation), which results in a self-assembly of the copolymer solution into a phase-separated material (i.e., the block copolymer 380). The anneal process promotes cross-linking of the PS molecules through the removal of one hydrogen from a benzene-bonded carbon of the PS polymer chain, such that two PS polymer units or chains of such ionized units may cross-link. The anneal process simultaneously degrades the PMMA polymer unit through the removal of one hydrogen from a methylidene molecule ($CH_2$) bonded to two carbons of the PMMA polymer unit. After the anneal process, the block copolymer 380 comprises a polymer matrix 384 of the first polymer species (PMMA), and a plurality of cylindrical micro-domains 382 of the second polymer species (PS), as shown in FIG. 11. In some embodiments, the block copolymer 380 comprises a thickness of less than about 1,000 Å.

Figure 12:
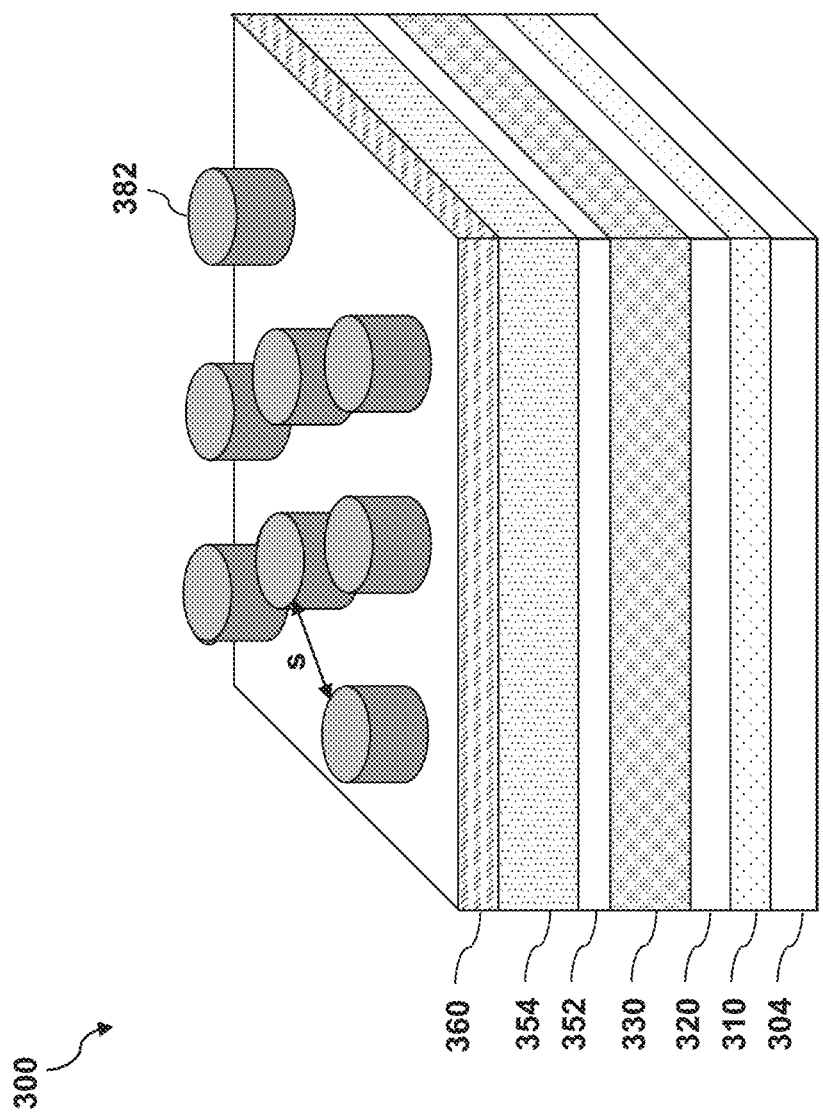

The first polymer species may then be removed (i.e., the polymer matrix 384) through an oxygen reactive ion etch (RIE), which leaves the pattern of micro-domains 382 of the second polymer species, such as shown in FIG. 12. In the illustrated embodiment, the micro-domains 382 comprise a pattern of polymer pillars residing in a periodic hexagonal close-packed (HCP) arrangement with minimum space(s) of less than about 30 nm. The micro-domains 382 then act as an etching mask to transfer the pattern to the hard mask layer 360. In some embodiments, the micro-domains 382 are directly formed on the upper electrode layer 354 without forming the hard mask layer 360, where the micro-domains 382 act as a patterned hard mask for subsequent patterning.

Figure 13:
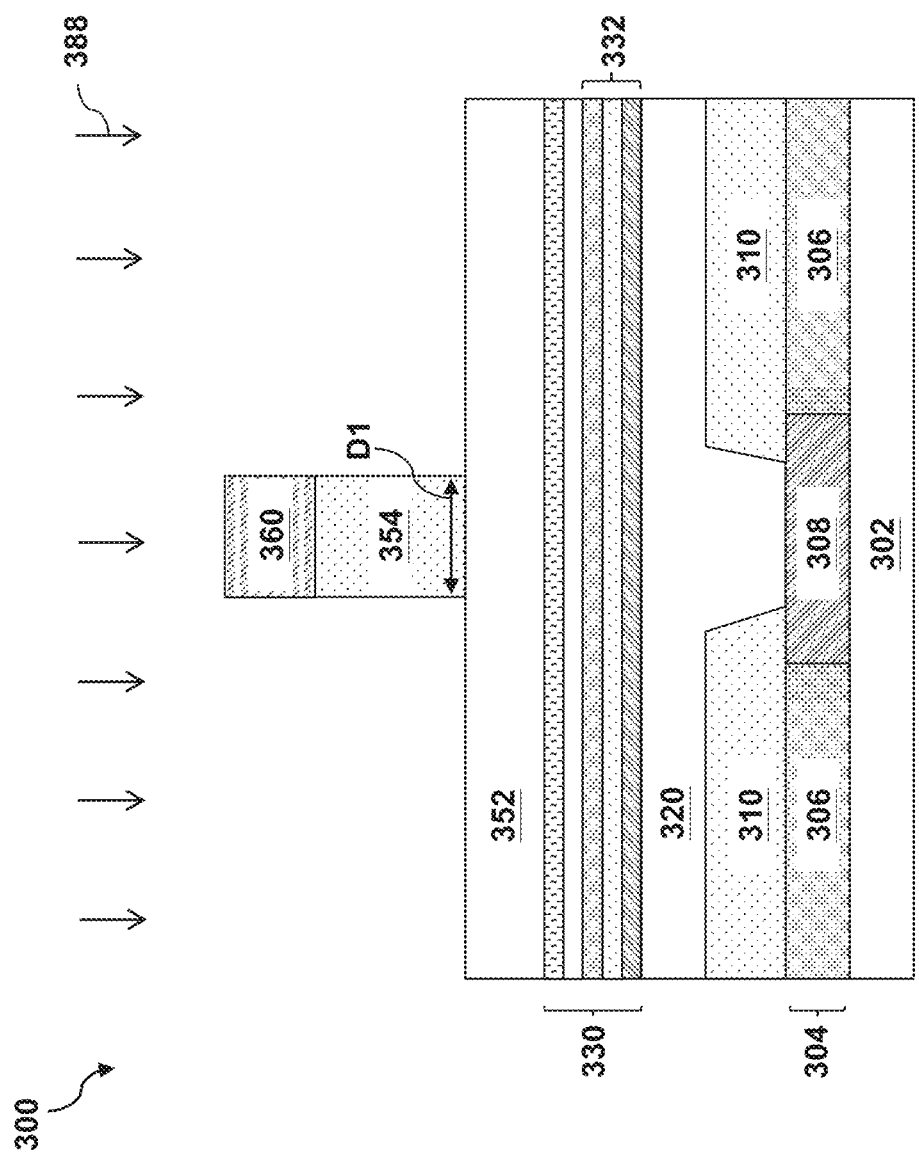

At operation 214, the method 200 (FIG. 2B) selectively etches the upper electrode layer 354 using the patterned hard mask layer 360 as an etching mask, such as shown in FIG. 13. As discussed above, the compositions of the upper electrode layer 354 and the lower electrode layer 352 are selected such that the upper electrode layer 354 has a high etching selectivity as compared to the lower electrode layer 352. As an example, operation 214 uses an etching process 388 that exhibits a larger than 10:1 etching selectivity of the upper electrode layer 354 over the lower electrode layer 352. As a result, the etching process 388 removes portions of the upper electrode layer 354 not covered by the hard mask layer 360 and the lower electrode layer 352 remains relatively and/or substantially unchanged in thickness. Operation 214 may use a dry etching, a wet etching, or other suitable etching processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In some embodiments, the etching process is an RIE process under process parameters such as a source power ranging from about 900 W to about 1200 W, a bias voltage ranging from about 0 V to about 500 V, a gas flow ranging from about 10 sccm to about 200 sccm, and a temperature ranging from about 15 degrees in Celsius to about 55 degrees in Celsius. The etchant gas may include $Cl_2$, $SiCl_4$, $BCl_3$, $NF_3$, $N_2$, $H_2$, $CH_4$, HBr, He, Ar, or a combination thereof. The thickness of the lower electrode layer 352 is larger than about 35% of the MTJ stack 330, which effectively blocks etchant molecules from penetrating into the MTJ layers and from causing damages.

In some embodiments, operation 214 uses an end-point control method to precisely control the etching time. An end-point control analyzes emitted residuals in real time during an etching process, such as by inspecting light spectra emitted by a plasma during a plasma etching with an optical emission spectroscopy (OES). When material compositions from the lower electrode 352 start being detected, the etching process 388 stops at the upper surface of the lower electrode 352. In some embodiments, a pattern of cylindrical pillars in the patterned hard mask layer 360 is transferred to the upper electrode layer 354 when the etching process 388 stops. Each pillar may have a diameter ($D_1$) about 40 nm.

Figure 14:
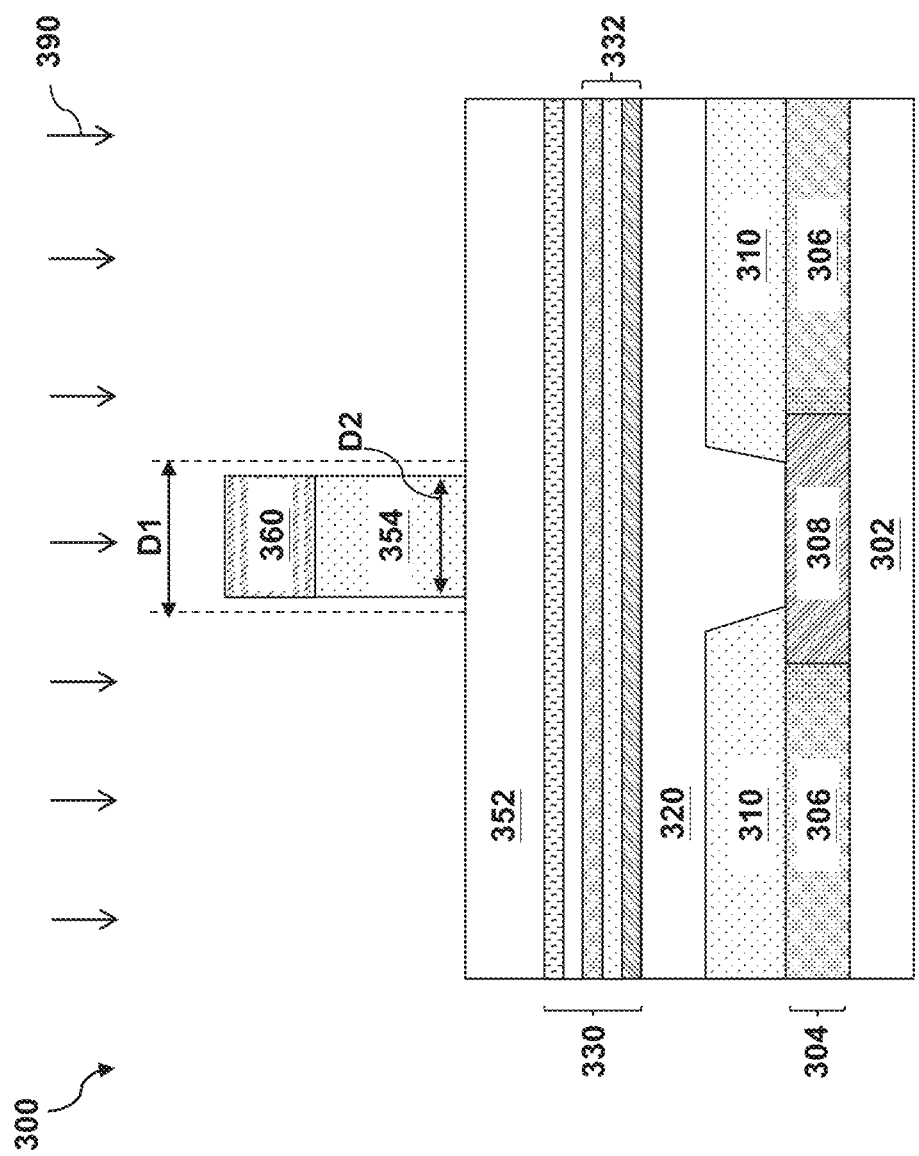

At operation 216, the method 200 (FIG. 2B) trims the patterned upper electrode layer 354, such as shown in FIG. 14. The patterned upper electrode layer 354 is trimmed by a trimming process 390. In an embodiment, the trimming process 390 is a dry etching process. In a further embodiment, the trimming process 390 is an isotropic dry etching process. The etchant gas may include $Cl_2$, $SiCl_4$, $BCl_3$, $NF_3$, $N_2$, $H_2$, $CH_4$, HBr, He, Ar, or a combination thereof. In some embodiments, the trimming process 390 may use another fluorine-containing gas (e.g., $SF_6$, $CH_2F_2$, $CHF_3$, and/or $C_2F_6$), an oxygen-containing gas, a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In various embodiments, the trimming process 390 uses an etchant that is selectively tuned to etch the patterned upper electrode layer 354 while the lower electrode layer 352 remains substantially unchanged. In one example, the trimming process 390 is an RIE process performed at a source power about 1500 W, a bias voltage ranging from about 0 V to about 50V, a gas flow ranging from about 10 sccm to about 250 sccm, a pressure ranging from about 5 to 40 mTorr.

The trimming process 390 helps to achieve a minimum critical dimension (CD) below the lower resolution limit of some optical lithography techniques. In an embodiment, the patterned upper electrode 354 is trimmed such that the trimmed diameter ($D_2$) shrinks about 10% to 30% ($D_2/D_1 \approx 0.7$-$0.9$). In the illustrated embodiment, $D_2$ is about 30 nm, approximately 10 nm reductions from $D_1$. It is noted that the trimming process 390 further removes any footing profile at the bottom of the patterned upper electrode layer 354, due to the highly directional isotropic dry etching. A footing profile may cause problems in CD bias when transferring a pattern to lower material layers. By eliminating footing profile, the trimming process further achieves a substantially straight sidewall that is perpendicular to the upper surface of the lower electrode layer 352. The vertical sidewall assists to transfer the vertical profile to MTJ stack 330 in subsequent operations. After trimming the patterned top electrode layer 354, the patterned hard mask layer 360 may be removed.

Figure 15:
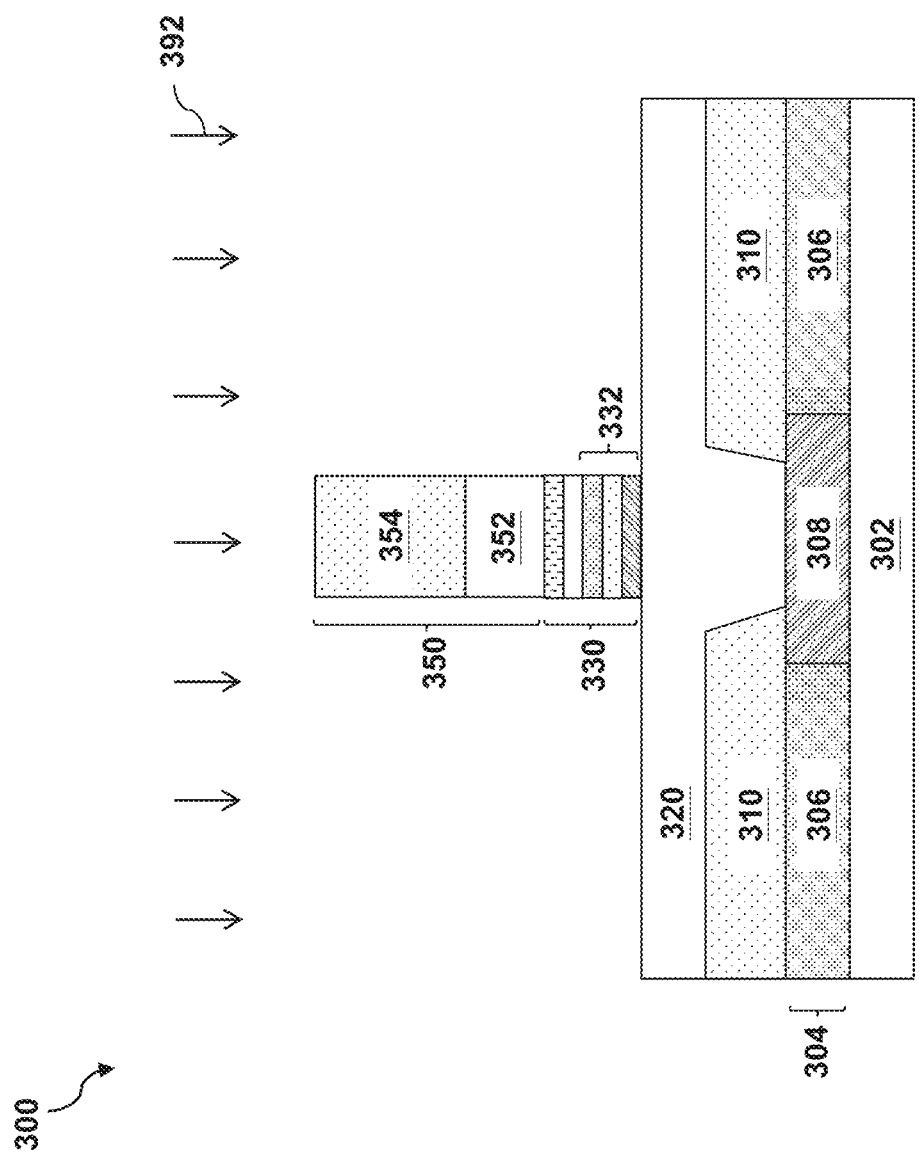

At operation 218, the method 200 (FIG. 2B) etches the lower electrode layer 352 and the MTJ stack 330 using the trimmed top electrode layer 354 as an etching mask, such as shown in FIG. 15. Operation 218 includes an etching process 392 to etch through the lower electrode layer 352 and the MTJ stack 330. In an embodiment, the etching process 392 is an isotropic dry etching process. In some embodiments, the etching process 392 transfers a pattern of pillar array (e.g., cylindrical pattern) into the lower electrode layer 352 first, followed by the removal of portions of the MTJ stack 330 using the upper and lower electrode layers 354 and 352 together as an etching mask. In some embodiments, the etching process 392 etches the lower electrode layer 352 and the MTJ stack 330 together with no intermediate etching step.

Figure 16:
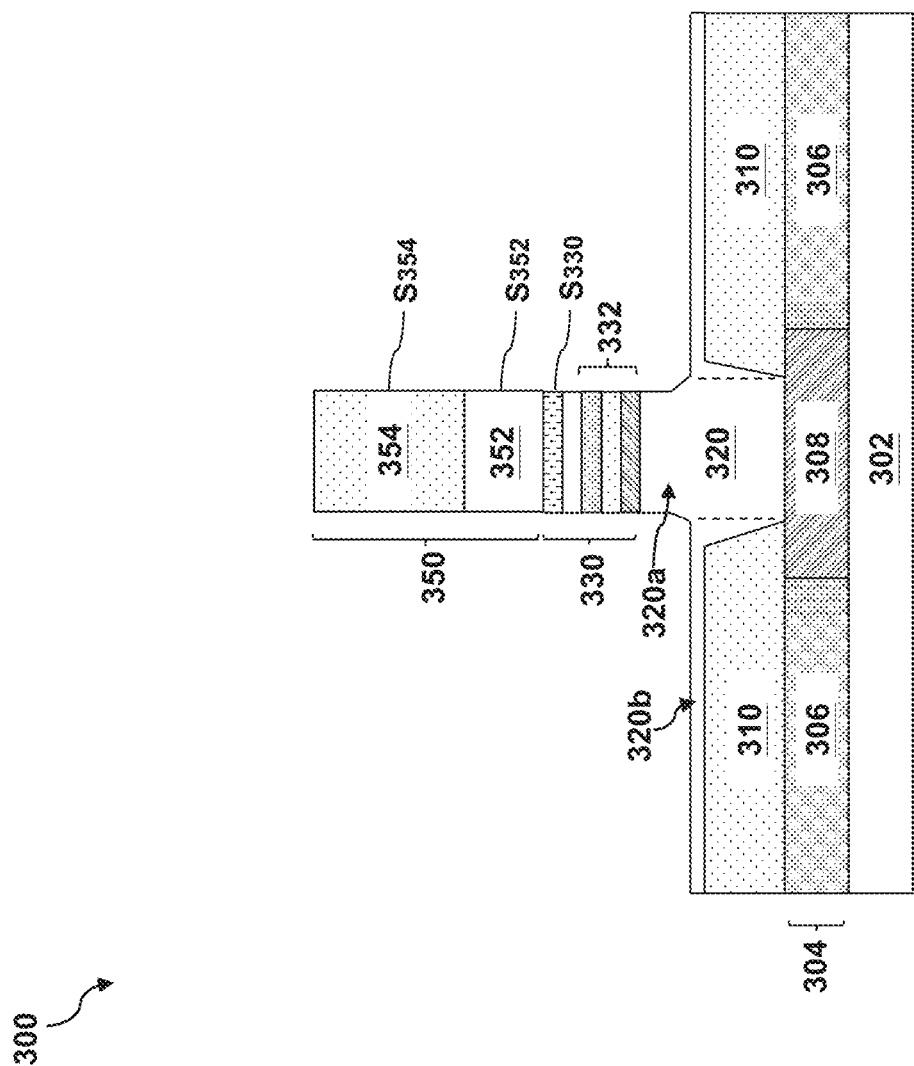

Operation 218 may further etch into a top portion of the bottom electrode layer 320 using the patterned top electrode layer 350 and the MTJ stack 330 as an etching mask, such as shown in FIG. 16. In some embodiments, the etching of the top portion of the bottom electrode layer 320 comprises applying a wet etchant or a plasma etchant for a predetermined period of time. After the removal of the top portion, the bottom electrode layer 320 can be regarded as comprising a central bottom electrode portion 320a which extends downwardly through the dielectric-protection layer 310 to contact the underlying metal line 308 and a peripheral bottom electrode portion 320b which surrounds the central bottom electrode portion 320a. The peripheral bottom electrode portion 320b may extend to physically connect with other peripheral bottom electrode portions of adjacent MRAM cells, thereby forming a word line (e.g., word line $WL_1$ in FIG. 1C) in an MRAM cell array. A sidewall of the central bottom electrode portion 320a may further have a footing profile interfacing with an upper surface of the peripheral bottom electrode portion 320b. In the illustrated embodiment, the central bottom electrode portion 320a has a top surface smaller in area than a bottom surface.

After patterning the top electrode layer 350, the MTJ stack 330, and the bottom electrode layer 320, for the sake of simplicity of description, the patterned top electrode layer 350 is denoted as the top electrode 350, the patterned MTJ stack 330 is denoted as the MTJ 330, and the patterned bottom electrode layer 320 is denoted as the bottom electrode 320. In some embodiments, the sidewall $S_{354}$ of the upper electrode 354 is substantially perpendicular to the top surface of the substrate 302, while the sidewall $S_{352}$ of the lower electrode 352 is tapered away from the sidewall $S_{354}$. For example, the sidewall $S_{354}$ may form an angle from about 88° to about 90° with respect to the top surface of the substrate 302, and the sidewall $S_{352}$ may form an angle from about 85° to about 88° with respect to the top surface of the substrate 302. With the tapered sidewall $S_{352}$, the lower electrode 352 has a larger bottom surface area than its top surface area, while the top surface area equals a bottom surface area of the upper electrode 354. In some embodiments, the sidewall $S_{330}$ of the MTJ 330 is further tapered away from the sidewall $S_{352}$. For example, the sidewall $S_{330}$ may form an angle from about 80° to about 85° with respect to the top surface of the substrate 302.

Figure 17:
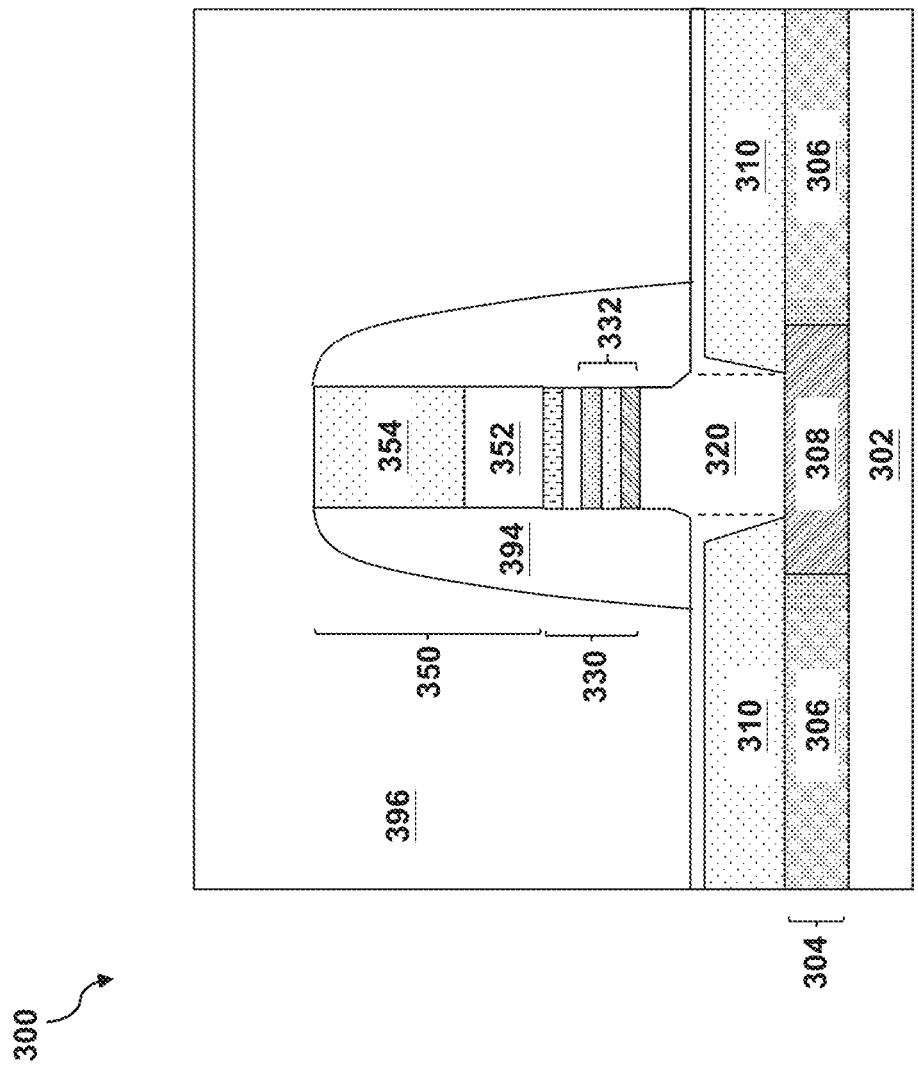

At operation 220, the method 200 (FIG. 2B) forms a sidewall spacer 394 covering sidewalls of the top electrode 350, the MTJ 330, and the bottom electrode 320, such as shown in FIG. 17. The sidewall spacer 394 may comprise a dielectric material, such as silicon oxide, silicon nitride, silicon oxynitride, silicon carbide, other dielectric material, or combinations thereof, and may comprise one or multiple layers of material. The sidewall spacer 394 may be formed by depositing a spacer material as a blanket layer over the device 300. Then the spacer material is etched by an anisotropic etching process. Portions of the spacer material on the sidewalls of the top electrode 350, the MTJ 330, and the bottom electrode 320 remain and become the sidewall spacer 394. The sidewall spacer 394 also covers a portion of the upper surface of the peripheral bottom electrode portion.

At operation 222, the method 200 (FIG. 2B) forms an inter-metal dielectric (IMD) layer 396 covering the sidewall spacer 394, such as shown in FIG. 17. The IMD layer 396 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The IMD layer 396 may be formed by PECVD, FCVD, or other suitable methods. In some embodiments, the IMD layer 396 is formed of a low-k dielectric layer or an extreme low-k dielectric layer, to a thickness of approximately 2500 Å. If an extreme low-k dielectric layer is used, a curing process may be followed after depositing the extreme low-k dielectric layer to increase its porosity, lower the k value, and improve the mechanical strengths. The operation 222 also performs one or more CMP processes to planarize the top surface of the device 300.

Figure 18:
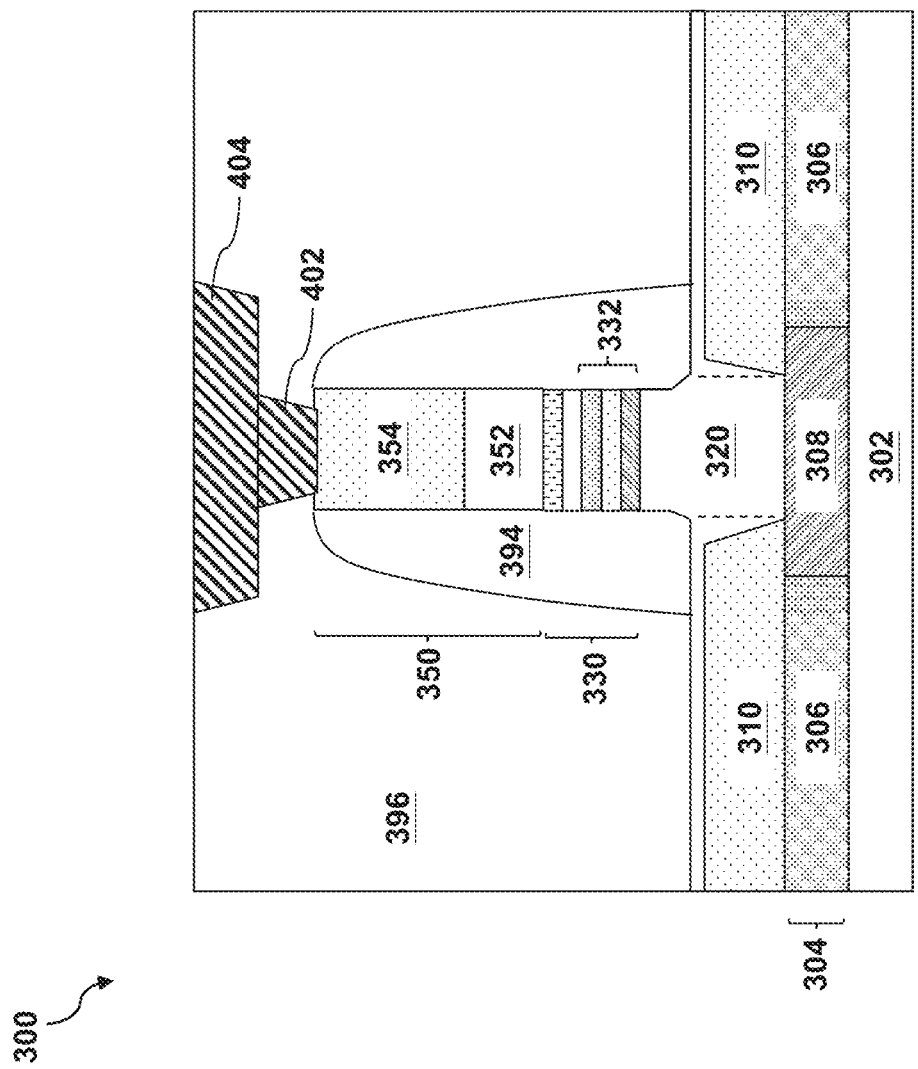

At operation 224, the method 200 (FIG. 2B) performs further steps to complete the fabrication of the device 300. For example, the method 200 may form a via opening and a trench opening (not shown) in the IMD layer 396 and deposit conductive materials therein to provide interconnections, such as the top electrode via (TEVA) 402 that lands on the top electrode 350 and the metal trench 404, such as shown in FIG. 18. The metal trench 404 is part of a metallic interconnection layer, such as a bit line (e.g., bit line $BL_1$ in FIG. 1C) in an MRAM cell array. The TEVA 402 electrically connects an MRAM cell to the metallic interconnection layer. In some embodiments, the TEVA 402 and the metal trench 404 comprise tungsten or copper. The TEVA 402 and the metal trench 404 can be formed by a damascene or dual-damascene process.

Figure 19:
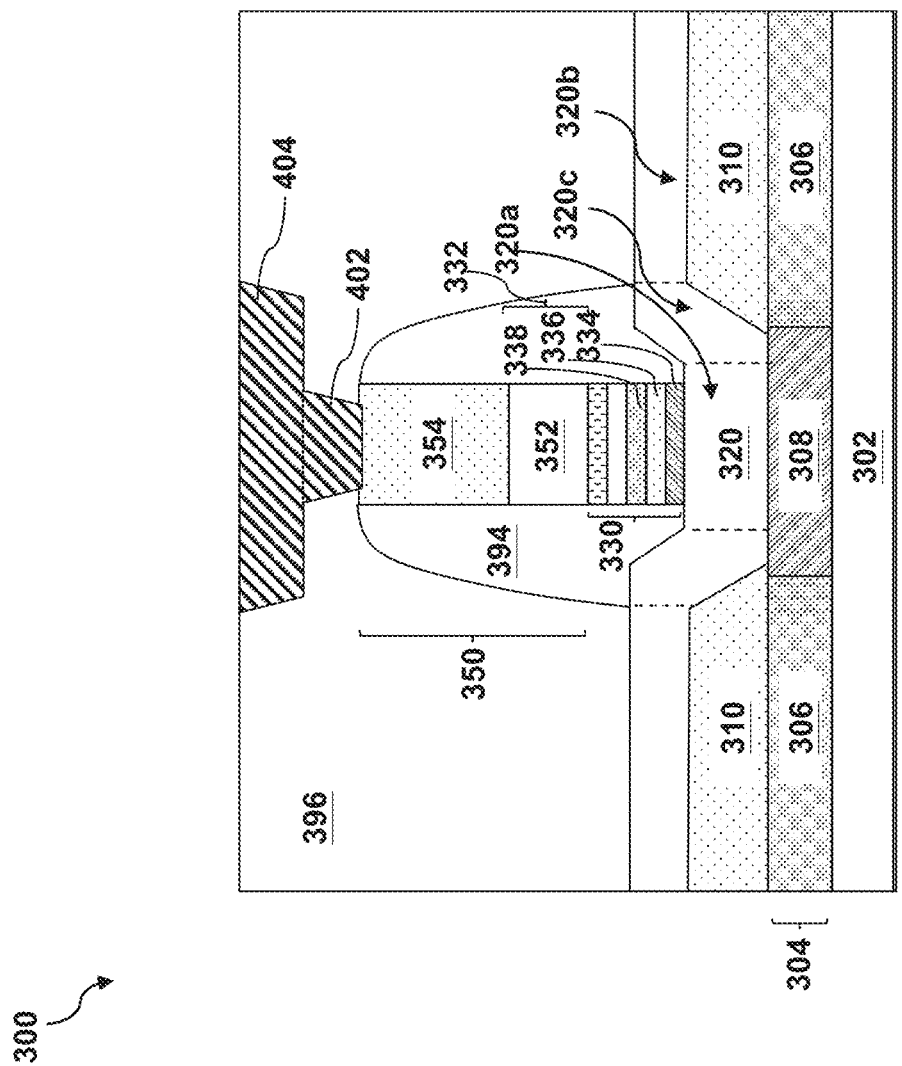

An alternative embodiment of an MRAM cell is illustrated in FIG. 19. At operation 206, the method 200 (FIG. 2A) may deposit the bottom electrode layer 320 as a conformal layer. Consequently, the bottom electrode layer 320 comprises a central bottom electrode portion 320a, a step portion 320c, and a peripheral bottom electrode portion 320b, such that an upper surface of the central bottom electrode portion 320a is recessed relative to an upper surface of the peripheral bottom electrode portion 320b. The central bottom electrode portion 320a extends downwardly through the dielectric-protection layer 310 to make direct electrical contact with the underlying metal line 308. A step portion 320c extends upwardly from the central bottom electrode portion 320a and along the sidewalls of the dielectric-protection layer 310 to couple the central bottom electrode portion 320a to peripheral bottom electrode portion 320b. The central bottom electrode portion 320a, step portion 320c, and peripheral bottom electrode portion 320b can be a continuous, seamless body of conductive material. The upper surface of the central bottom electrode portion 320a can be substantially and continuously planar between the step portion 320c, and a lower surface of the MTJ 330 is disposed on the upper surface of the central bottom electrode portion 320a. An MRAM cell deposited above a recessed bottom electrode has a reduced overall height, making the MRAM cell more easily compatible with BEOL process flows. In some embodiments, upper surfaces of one or more sub-layers of the lower ferromagnetic electrode layer 332 are lower than an upper surface of the peripheral bottom electrode portion 320b. In one example, an upper surface of the bottom pinned ferromagnetic layer 334 is lower than an upper surface of the peripheral bottom electrode portion 320b and an upper surface of the metal layer 336 is above the upper surface of the peripheral bottom electrode portion 320b. In another example, an upper surface of the metal layer 336 is lower than an upper surface of the peripheral bottom electrode portion 320b and an upper surface of the top pinned ferromagnetic layer 338 is above the upper surface of the peripheral bottom electrode portion 320b. Sidewall spacers 394 extend continuously over upper surfaces of the peripheral bottom electrode portion 320b, step portion 320c, and optionally outer portions of the central bottom electrode portion 320a, and extend upwardly along sidewalls of the MTJ 330 and the top electrode 350.

Figure 20A:
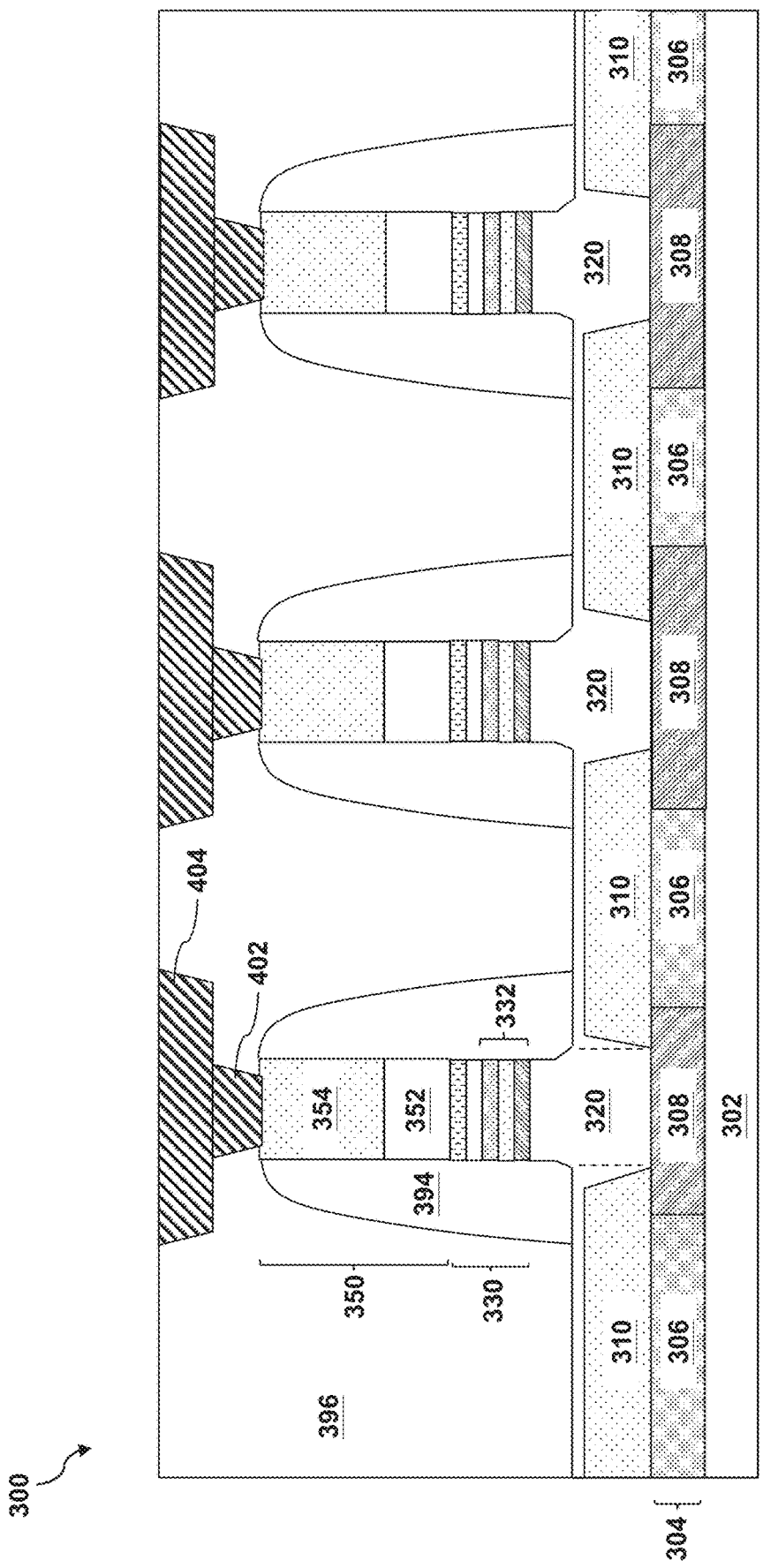
Figure 20B:
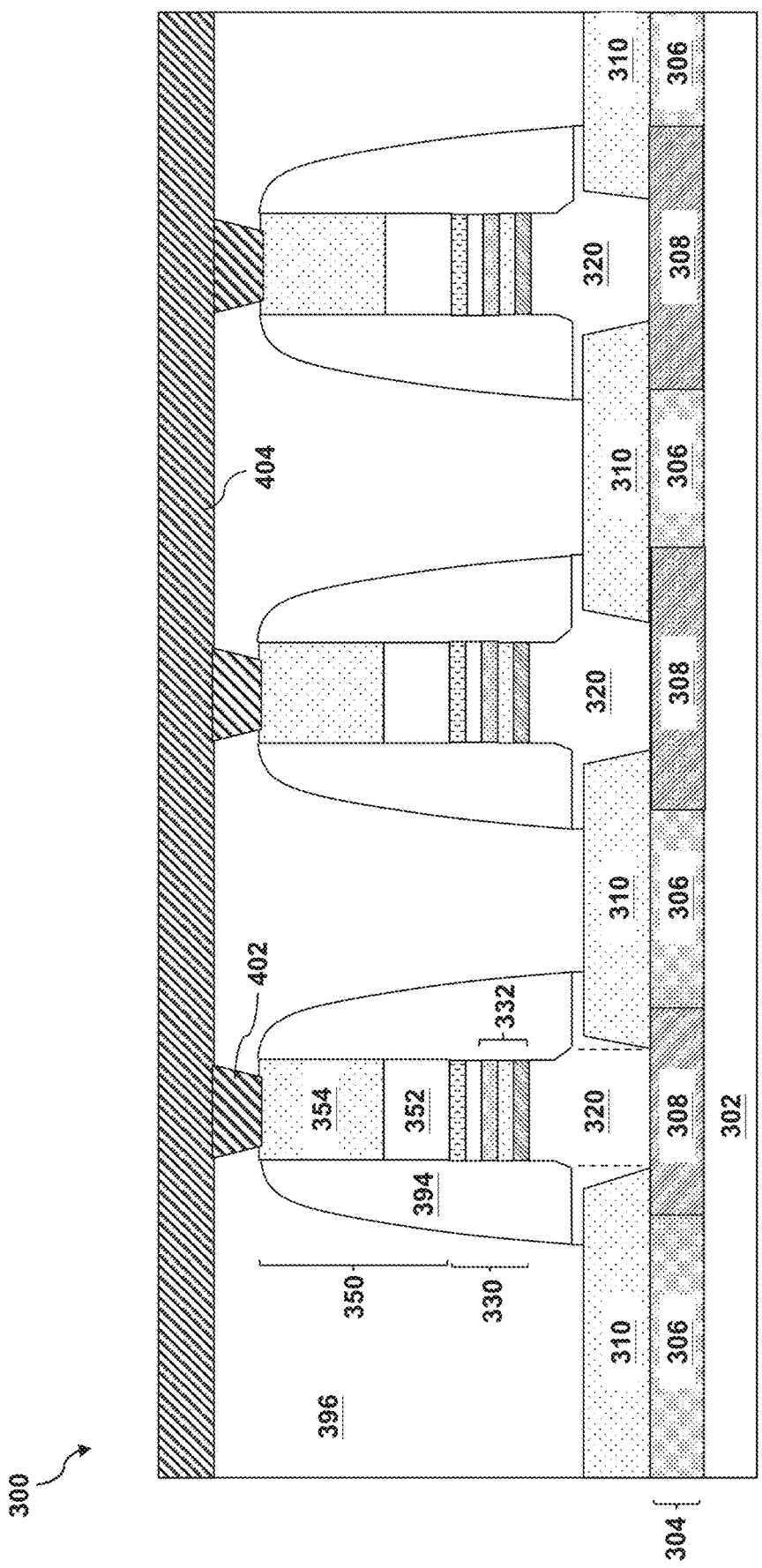

FIG. 20A illustrates a cross-sectional view of the MRAM cell array in FIG. 1C along the A-A line. FIG. 20B illustrates a cross-sectional view of the MRAM cell array in FIG. 1C along the B-B line. In FIG. 20A, a plurality of MRAM cells are deposited sequentially along a word line (e.g., the word line $WL_1$ in FIG. 1C). The bottom electrode layer 320 is a continuous conductive body extending beneath each MTJ of the plurality of MRAM cells along the word line. The bottom electrode layer 320 is equivalently in parallel connection with the word line (e.g., metal lines 308 embedded in the interconnect structure 304), which reduces conductive resistance of the word line. In FIG. 20B, another plurality of MRAM cells are deposited sequentially along a bit line (e.g., the bit line $BL_1$ in FIG. 1C). The TEVA 402 and metal trench 404 form a continuous conductive body extending above the MRAM cells as a bit line. The bottom electrode layer 320 is discontinued between two adjacent MRAM cells to avoid shorting different word lines, which may be formed by selectively etching portions of the peripheral bottom electrode portion between adjacent MRAM cells along a bit line. The selective etching process may include wet etching, dry etching, and/or other suitable etching methods, through a patterned hard mask (not shown).

Figure 21:
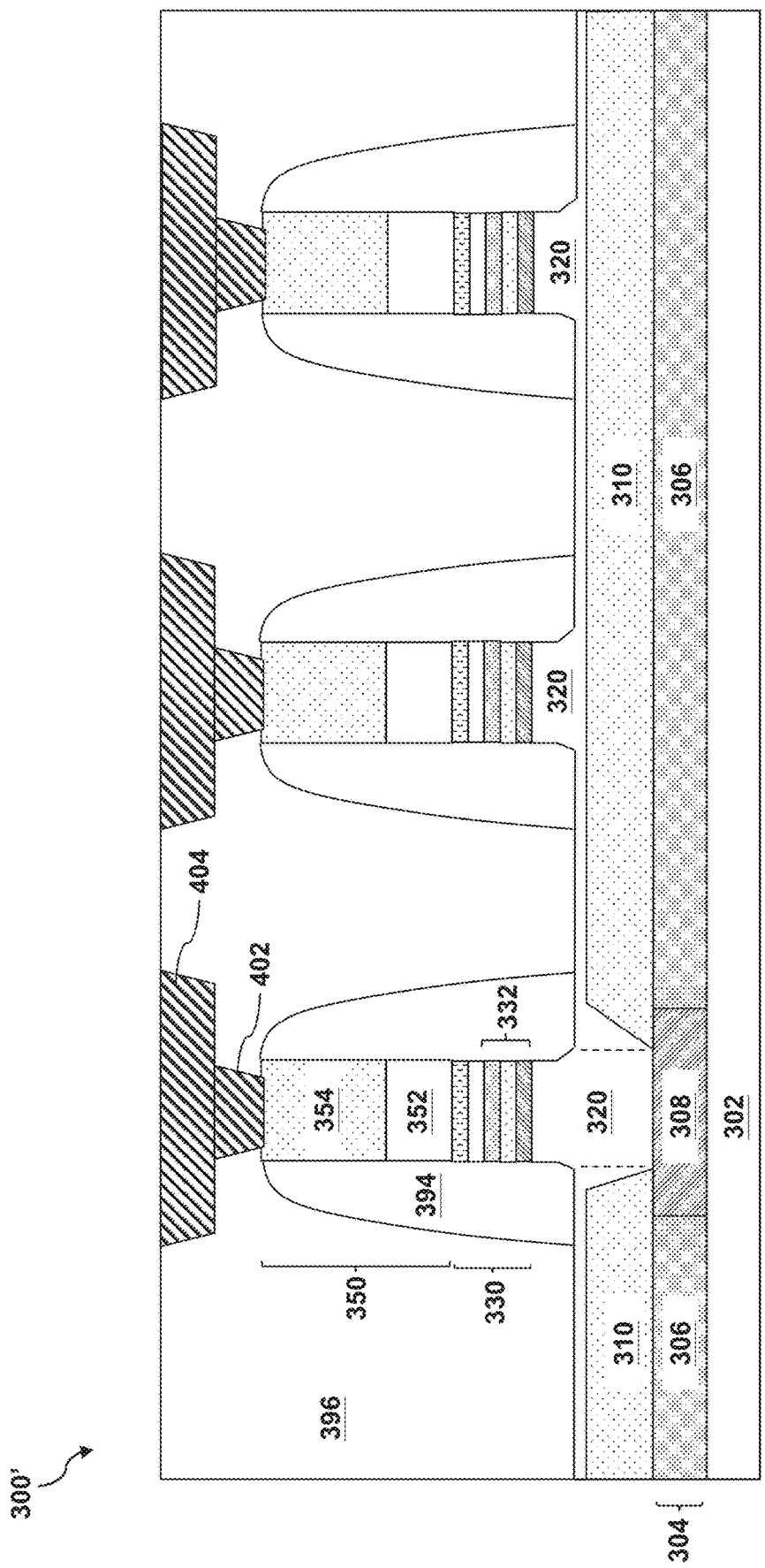

FIG. 21 illustrates a cross-section view of the MRAM cell array in FIG. 1C along the A-A line in some alternative embodiments. Similar to the device 300 illustrated in FIG. 20A, a plurality of MRAM cells are deposited sequentially along a word line (e.g., the word line $WL_1$ in FIG. 1C). The bottom electrode layer 320 is a continuous conductive body extending beneath each MTJ of the plurality of MRAM cells along the word line. Different from the device 300 illustrated in FIG. 20A, the device 300' in FIG. 21 has the metal line 308 underlying only the first MRAM cell along a word line. The bottom electrode layer 320 under the other MRAM cells subsequent to the first MRAM cell along a word line does not extend downwardly through the dielectric-protection layer 310. The continuous bottom electrode layer 320 alone is configured to work as the word line for all the MRAM cells in the same word line. The device 300' simplifies the interconnect structure 304 and reduces fabrication cost in avoiding forming extra openings in the dielectric-protection layer 310.

Although not intended to be limiting, one or more embodiments of the present disclosure provide many benefits to a semiconductor device and the formation thereof. For example, embodiments of the present disclosure provide an MRAM cell array achieving a minimum MTJ critical dimension. The present disclosure also helps to maintain the uniformity of the MTJ CD at a wafer scale. Furthermore, formation of this MRAM cell array can be easily integrated into existing semiconductor fabrication processes.

In one exemplary aspect, the present disclosure is directed to a magnetic memory device. The magnetic memory device includes a bottom electrode; a magnetic tunneling junction disposed over the bottom electrode; and a top electrode disposed directly over the magnetic tunneling junction, wherein the top electrode includes a first top electrode layer and a second top electrode layer above the first top electrode layer, and wherein the second top electrode layer is thicker than the first top electrode layer. In some embodiments, a sidewall of the first top electrode layer is tapered away from a sidewall of the second top electrode layer. In some embodiments, the first top electrode layer includes TiN and the second top electrode layer includes Ta. In some embodiments, the first top electrode layer includes metallic carbide and the second top electrode layer includes Ta. In some embodiments, the first top electrode layer is thinner than the magnetic tunneling junction and the second top electrode layer is thicker than the magnetic tunneling junction. In some embodiments, the first top electrode layer is thicker than about 35% of a thickness of the magnetic tunneling junction and the second top electrode layer is thicker than about 110% of the thickness of the magnetic tunneling junction. In some embodiments, the bottom electrode has a central bottom electrode portion surrounded by a peripheral bottom electrode portion, and wherein a top surface of the central bottom electrode portion is above a top surface of the peripheral bottom electrode portion. In some embodiments, the top surface of the central bottom electrode portion is smaller than a bottom surface of the central bottom electrode portion. In some embodiments, a top surface area of the first top electrode layer equals a bottom surface area of the second top electrode layer.

In another exemplary aspect, the present disclosure is directed to a method. The method includes forming a bottom electrode layer over a substrate; forming a magnetic tunneling junction stack over the bottom electrode; forming a top electrode layer over the magnetic tunneling junction stack, the top electrode including a first top electrode layer and a second top electrode layer over the first top electrode layer, the first top electrode layer and the second top electrode layer having different metallic compositions; forming a patterned dielectric layer over the top electrode layer; etching the second top electrode layer with the patterned dielectric layer as an etching mask and the first top electrode layer as an etching stop layer; and patterning the first top electrode layer and the magnetic tunneling junction stack with the etched second top electrode layer as a patterning mask. In some embodiments, the method further includes after the etching of the second top electrode layer, trimming a width of the etched second top electrode layer. In some embodiments, the method further includes patterning a top portion of the bottom electrode layer, thereby forming a central bottom electrode portion surrounded by a peripheral bottom electrode portion. In some embodiments, the etching of the second top electrode layer is controlled by detecting material compositions emitted from the first top electrode layer. In some embodiments, the first top electrode layer is thinner than the magnetic tunneling junction stack and the second top electrode layer is thicker than the magnetic tunneling junction stack. In some embodiments, the first top electrode layer includes TiN and the second top electrode layer includes Ta. In some embodiments, during the etching of the second top electrode layer, an etching selectivity of the second top electrode layer over the first top electrode layer is larger than 10:1. In some embodiments, the forming of the patterned dielectric layer includes forming polymer pillars in a polymer matrix during a polymer self-assembling process.

In yet another exemplary aspect, the present disclosure is directed to a method of forming a magnetic random-access memory (MRAM). The method includes providing a semiconductor substrate; forming a bottom electrode layer over the semiconductor substrate; forming a magnetic tunneling junction stack over the bottom electrode layer, wherein the magnetic tunneling junction stack includes a lower ferromagnetic layer, a tunneling barrier layer over the lower ferromagnetic layer, and an upper ferromagnetic layer over the tunneling barrier layer; forming a first top electrode layer over the magnetic tunneling junction stack; forming a second top electrode layer over the first top electrode layer, wherein the first and second top electrode layers includes different conductive material compositions; forming a mask layer over the second top electrode layer; patterning the mask layer; etching the second top electrode layer, thereby transferring a pattern in the patterned mask layer to the second top electrode layer; trimming a width of the second top electrode layer; and etching the first top electrode layer and the magnetic tunneling junction stack with the trimmed second top electrode layer as an etching mask. In some embodiments, the second top electrode layer is thicker than the first top electrode layer. In some embodiments, the forming of the first top electrode layer and the forming of the second top electrode layer both include performing a PVD process with a temperature above 300 degrees in Celsius.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a bottom electrode;
   a tunneling junction disposed over the bottom electrode; and
   a top electrode disposed over the tunneling junction,
   wherein the bottom electrode includes a top portion, a middle portion disposed below the top portion, and a bottom portion disposed below the middle portion, and
   wherein the middle portion extends laterally beyond a sidewall of the top portion and a sidewall of the bottom portion,
   wherein the top portion has a first width and the bottom portion has a second width greater than the first width,
   wherein the sidewall of the bottom portion of the bottom electrode tapers outward from bottom to top,
   wherein the sidewall of the top portion of the bottom electrode includes a footing profile intersecting with a top surface of the middle portion of the bottom electrode,
   wherein the top electrode includes a first top electrode layer and a second top electrode layer above the first top electrode layer, wherein the first and second top electrode layers include different material compositions, and wherein the first top electrode layer is thinner than the tunneling junction and the second top electrode layer is thicker than the tunneling junction.

2. The memory device of claim 1, wherein a sidewall of the first top electrode layer is tapered away from a sidewall of the second top electrode layer.

3. The memory device of claim 1, wherein the first top electrode layer includes TiN and the second top electrode layer includes Ta, and
   wherein the memory device further comprises a first dielectric layer and a second dielectric layer disposed on a top surface of the middle portion of the bottom electrode on a same side of the tunneling junction.

4. The memory device of claim 1, wherein the first top electrode layer includes a metallic carbide and the second top electrode layer includes Ta.

5. The memory device of claim 1, wherein the first top electrode layer has a thickness larger than about 35% of a thickness of the tunneling junction, and the second top electrode layer has a thickness larger than about 110% of the thickness of the tunneling junction.

6. The memory device of claim 5, wherein the thickness of the first top electrode layer ranges from about 35% to about 90% of the thickness of the tunneling junction, and the thickness of the second top electrode layer ranges from about 110% to about 300% of the thickness of the tunneling junction.

7. The memory device of claim 1, wherein a topmost surface of the top portion of the bottom electrode is smaller than a bottommost surface of the bottom portion of the bottom electrode.

8. The memory device of claim 1, wherein a top surface of the top portion of the bottom electrode is above a top surface of the middle portion of the bottom electrode, and
   wherein the bottom portion of the bottom electrode extends laterally beyond the sidewall of the top portion of the bottom electrode.

9. A magnetic memory device, comprising:
   a bottom electrode;
   a magnetic tunneling junction above and in physical contact with the bottom electrode;
   a top electrode above and in physical contact with the magnetic tunneling junction; and
   a sidewall spacer on sidewalls of the top electrode, the magnetic tunneling junction, and the bottom electrode,
   wherein the bottom electrode includes a central bottom electrode portion surrounded by a peripheral bottom electrode portion,
   wherein a bottom surface of the peripheral bottom electrode portion is above a bottom surface of the central bottom electrode portion,
   wherein the central bottom electrode portion has a tapered sidewall,
   wherein the tapered sidewall is spaced apart from the sidewall spacer,
   wherein the peripheral bottom electrode portion extends laterally beyond a sidewall of the sidewall spacer, and
   wherein the top electrode includes a first top electrode layer and a second top electrode layer over the first top electrode layer, the first top electrode layer and the second top electrode layer have different metallic compositions, and a thickness of the first top electrode layer is smaller than that of the second top electrode layer.

10. The magnetic memory device of claim 9, wherein the first top electrode layer is thinner than the magnetic tunneling junction and the second top electrode layer is thicker than the magnetic tunneling junction, and
    wherein a top surface of the peripheral bottom electrode portion is below a top surface of the central bottom electrode portion.

11. The magnetic memory device of claim 9,
    wherein a sidewall of the first top electrode layer is tapered away from a sidewall of the second top electrode layer, and wherein a sidewall of the magnetic tunneling junction is further tapered away from the sidewall of the first top electrode layer.

12. The magnetic memory device of claim 9, further comprising:
    a dielectric layer surrounding a bottom portion of the central bottom electrode portion, wherein the peripheral bottom electrode portion that extends laterally beyond the sidewall of the sidewall spacer is directly above a top surface of the dielectric layer.

13. The magnetic memory device of claim 12, wherein the dielectric layer includes aluminum oxide and is a first dielectric layer, and
    wherein the magnetic memory device further comprises a second dielectric layer disposed over the sidewall spacer and over a top surface of the peripheral bottom electrode portion.

14. The magnetic memory device of claim 12, wherein a top surface of the peripheral bottom electrode portion is below a bottom surface of the magnetic tunneling junction.

15. The magnetic memory device of claim 12, wherein a top surface of the peripheral bottom electrode portion is above a bottom surface of the magnetic tunneling junction.

16. A semiconductor device, comprising:
    a bottom electrode over a substrate;
    a dielectric layer surrounding a bottom portion of the bottom electrode, wherein a peripheral portion of the bottom electrode is directly above a topmost surface of the dielectric layer;
    a lower ferromagnetic layer over the bottom electrode;
    a tunneling barrier layer over the lower ferromagnetic layer;
    an upper ferromagnetic layer over the tunneling barrier layer;
    a first top electrode over the upper ferromagnetic layer;
    a second top electrode over the first top electrode; and a spacer disposed on sidewalls of the bottom electrode and the lower ferromagnetic layer, wherein the bottom electrode has a bottommost surface wider than a top surface in contact with the lower ferromagnetic layer, wherein the spacer has an outer sidewall away from the sidewalls of the bottom electrode and the lower ferromagnetic layer, and wherein the peripheral portion of the bottom electrode extends laterally beyond the outer sidewall of the spacer.

17. The semiconductor device of claim 16, wherein a sidewall of the second top electrode forms a first angle with respect to a top surface of the substrate, a sidewall of the first top electrode forms a second angle with respect to the top surface of the substrate, and the first angle is larger than the second angle.

18. The semiconductor device of claim 16, wherein a top surface of the peripheral portion of the bottom electrode is above a top surface of the lower ferromagnetic layer.

19. The memory device of claim 1, further comprising a dielectric layer surrounding the bottom portion of the bottom electrode, wherein a portion of the middle portion of the bottom electrode is directly above a top surface of the dielectric layer.

20. The memory device of claim 9, wherein the sidewall of the sidewall spacer is away from the magnetic tunneling junction.

* * * * *